United States Patent [19]
Wada et al.

[11] Patent Number: 5,561,300
[45] Date of Patent: Oct. 1, 1996

[54] ATOMIC SWITCHING DEVICES AND LOGICAL CIRCUITS

[75] Inventors: Yasuo Wada, Tokyo; Seiichi Kondo, Saitama-ken; Tsuyoshi Uda, Kodaira; Masukazu Igarashi, Kawagoe; Hiroshi Kajiyama, Omiya; Hisashi Nagano, Saitama-ken; Akito Sakurai, Tsurugashima; Tsuneo Ichiguchi, Saitama-ken, all of Japan

[73] Assignee: Hitachi, Ltd., Tokyo, Japan

[21] Appl. No.: 994,968

[22] Filed: Dec. 22, 1992

[30] Foreign Application Priority Data

Dec. 24, 1991 [JP] Japan .................................. 3-340649
Dec. 26, 1991 [JP] Japan .................................. 3-344357
Feb. 6, 1992 [JP] Japan .................................. 4-020972
Sep. 22, 1992 [JP] Japan .................................. 4-252511

[51] Int. Cl.[6] .............................. H01J 37/30; H02B 1/24
[52] U.S. Cl. .................................. 250/492.2; 250/492.1; 250/306; 307/112.1; 307/139; 327/581
[58] Field of Search ........................ 250/492.2, 306, 250/307, 492.1, 492.3; 307/112, 139, 140, 143, 304, 125, 127; 257/3; 365/163

[56] References Cited

U.S. PATENT DOCUMENTS

| | | | |
|---|---|---|---|
| 4,761,548 | 8/1988 | Laul | 250/211 R |
| 5,166,919 | 11/1992 | Eigler | 369/126 |
| 5,252,835 | 10/1993 | Lieber et al. | 250/492.1 |
| 5,323,376 | 6/1994 | Eigler | 369/126 |
| 5,341,328 | 8/1994 | Ovshinsky et al. | 365/163 |

FOREIGN PATENT DOCUMENTS

| | | |
|---|---|---|
| 5175513 | 7/1993 | Japan . |
| 5175515 | 7/1993 | Japan . |

OTHER PUBLICATIONS

D. M. Eigler et al. "Positioning Single Atoms With Ascanning Tunnelling Microscope", NATURE, vol. 344, Apr. 5, 1990, pp. 524–526.

D. M. Eigler, et al., "An atomic switch realized with the scanning tunnelling microscope," NATURE vol. 352, 15 Aug. 1991, pp. 600–603.

*Primary Examiner*—Jack I. Berman
*Assistant Examiner*—Kiet T. Nguyen
*Attorney, Agent, or Firm*—Antonelli, Terry, Stout & Kraus

[57] ABSTRACT

In an atomic switch, opposite ends of an atom wire are connected to an input and output, and a switching gate is connected to a switching power supply. An input signal is outputted when a switching atom is connected to the atom wire, whereas an input signal is not outputted when the switching atom is moved to disconnect from the atom wire. There are provided an atom wire having a plurality of atoms arranged in a line or in a plurality of lines, in a ring shape, or in a curved line, and a switching gate made of an atom wire. The atom wire is switched by the field effect of the switching gate.

36 Claims, 18 Drawing Sheets

$W=(XS'+YU')T'+ZV'$

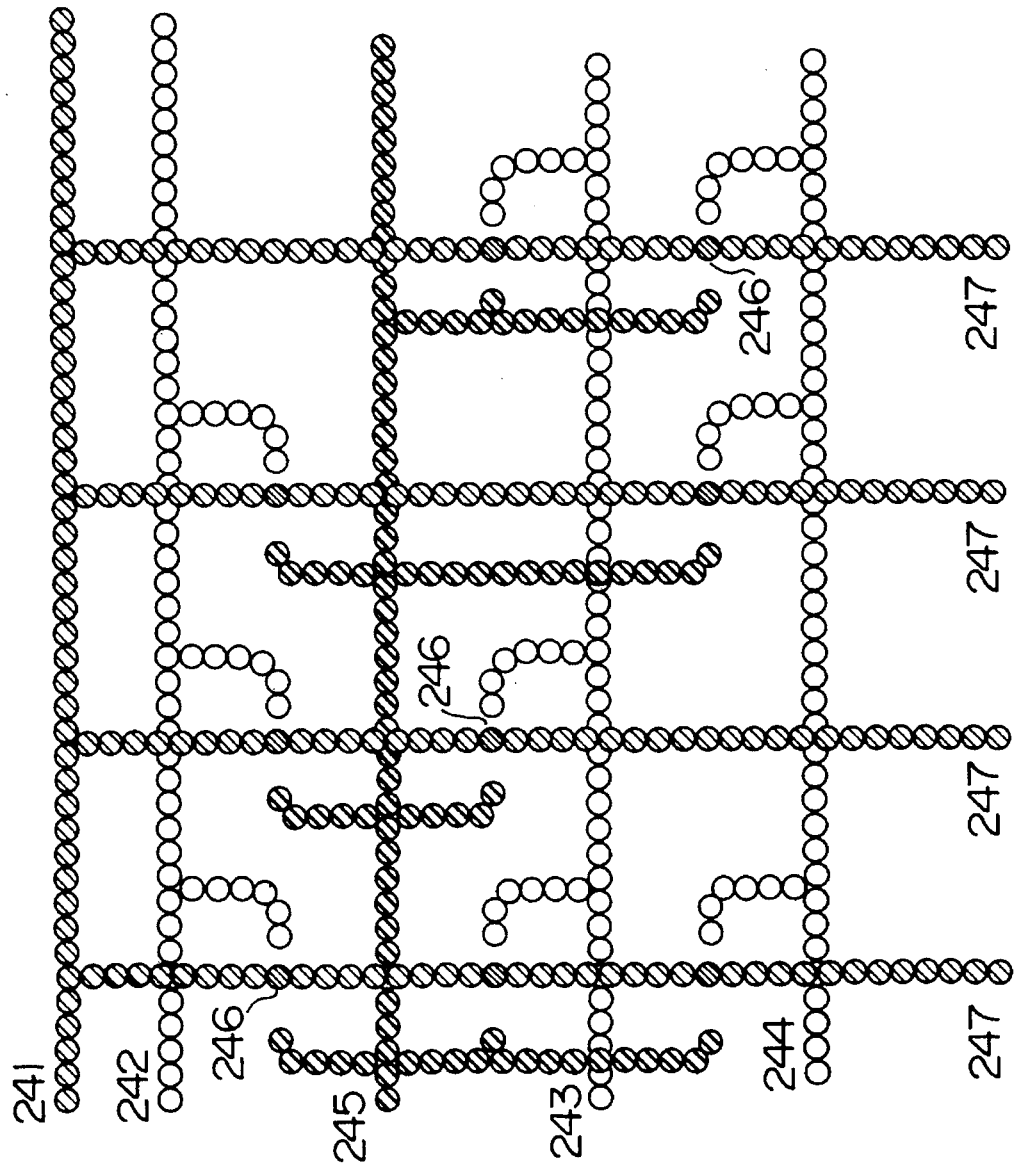

ATOM WIRE CIRCUIT

4nm -10nm

INTERFACE BETWEEN ATOM WIRE CIRCUIT AND QUANTUM WIRE CIRCUIT

40nm -100nm QUANTUM WIRE CIRCUIT

INTERFACE BETWEEN QUANTUM WIRE CIRCUIT AND SEMICONDUCTOR CIRCUIT

400nm -1000nm SEMICONDUCTOR CIRCUIT

QUANTUM WIRE CIRCUIT
SEMICONDUCTOR CIRCUIT
4mm -10mm MOUNT SUBSTRATE
ATOM WIRE CIRCUIT

4cm -10cm MAN-MACHINE INTERFACE

F I G. 27
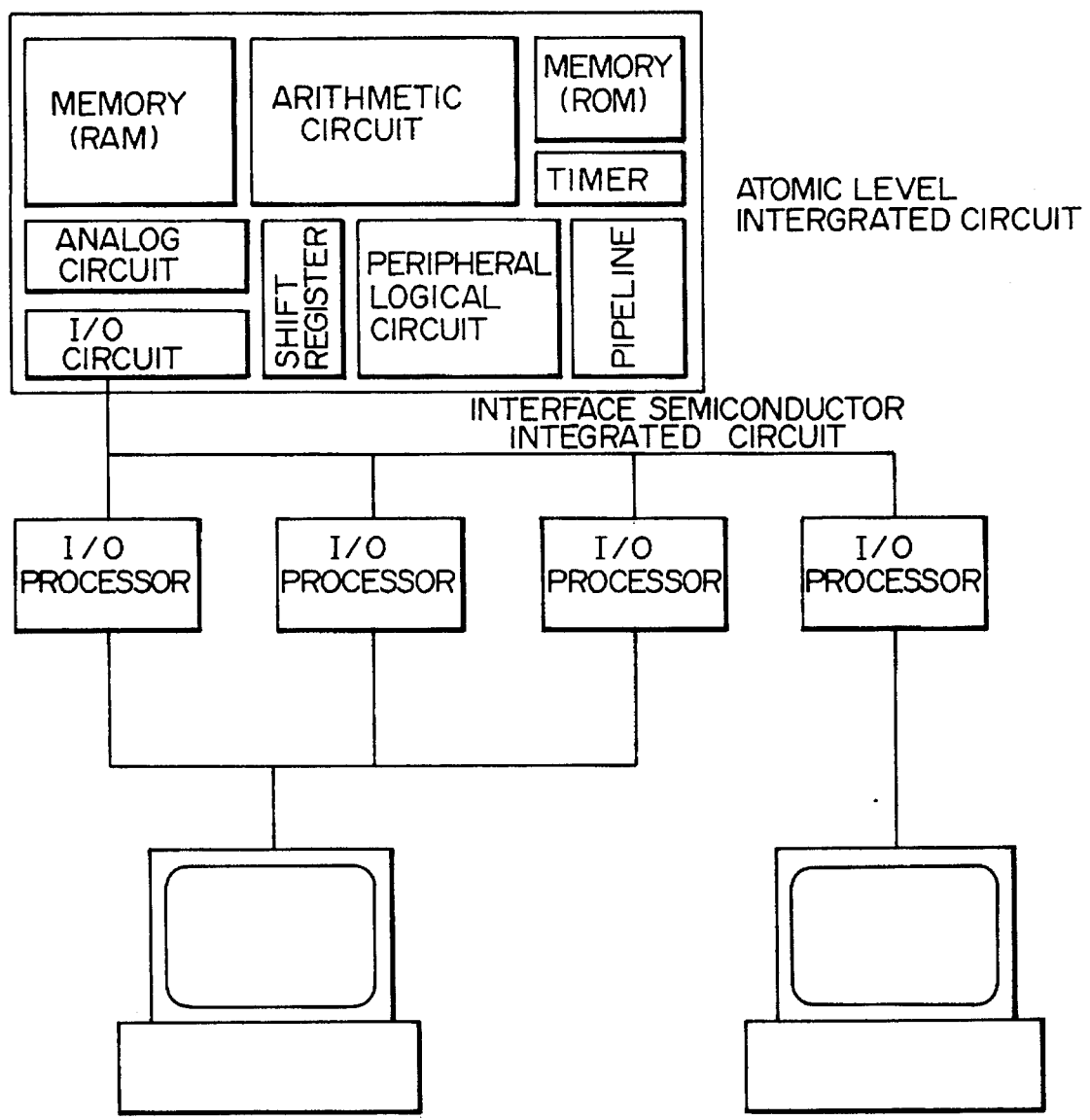

ATOMIC SWITCHING DEVICES AND LOGICAL CIRCUITS

BACKGROUND OF THE INVENTION

1. Field of the Invention

The present invention relates to atomic switching devices capable of providing extremely high integration density and extremely high speed operation, and logical circuits using such atomic switching devices. More particularly, the present invention relates to switching devices and logical circuits capable of providing extremely high integration density and extremely high speed operation, the high speed operation being realized by changing the conductance of an atom wire constituted by a plurality of atoms by moving a particular atom of the atom wire.

The present invention relates to ultra-fine electronics devices and logical circuits using such devices. More particularly, the present invention relates to an atom wire of an atomic level size having a plurality of atoms arranged in a line or in a plurality of lines, in a ring shape, or in a curved line, and relates to devices and logical circuits using such devices for switching an atom wire by the field effect of a gate made of an atom wire.

The present invention also relates to a method of configuring the uppermost surface structure of a substrate, of a device for switching an atom wire, or of a logical circuit using such a device. More particularly, the present invention relates to a method of configuring the surface structure of a substrate by controlling the positions of a plurality of atoms to be attached or removed by applying X-rays.

2. Description of the Related Art

The most typical one of conventional switching devices is a metal oxide semiconductor field effect transistor MOSFET. This device is constituted by a gate oxide film, gate, source, and drain formed on a silicon substrate. A channel is formed within the substrate in contact with the gate oxide film, and current flows between the source and drain. In a MOSFET, the conductance of the channel is controlled by a gate voltage.

The performance of a MOSFET is evaluated mainly by three factors: the level of voltage (threshold voltage) applied to the gate which is necessary for forming a channel, the channel conductance, and switching speed. The latter two factors are mainly determined by channel length, so that high performance has been dependent on a shorter gate length. The high performance of a MOSFET has been achieved heretofore depending in particular on a so-called scaling rule by which the size of a device is reduced three-dimensionally, i.e., height, width, and depth. Representing a proportional constant of device size reduction by k, the switching power consumption is proportional to $k^2$ and the switching time is proportional to k. The device performance is therefore improved by reducing the device size.

However, reducing device size has limits. The minimum dimension is considered as 0.1 µm at present in practical use. This limit is considered as being determined from a breakdown voltage of a p-n junction, a withstanding voltage of an insulating film, statistical variation of impurity concentrations, and wiring reliability. The depletion layer of a p-n junction is in the order of 20 nm to 30 nm, and the extension of the depletion layer when applying a voltage is in the order of 20 nm to 30 nm, totaling to about 0.1 µm. If the thickness of an insulating film is 4 nm or thinner, current may flow by a tunnel phenomenon, so that the film will no longer adequately provide the function of serving as an insulating film.

Furthermore, in such a fine device, the amount of impurity material present in one impurity diffused region becomes 100 or less. Therefore, the statistical variation becomes in excess of 10%, substantially resulting in an inability to manufacture such devices. With the present device structure using a bulk effect, devices having a size of 0.1 µm or smaller cannot be realized in practice.

Logical circuits using switching devices rely mainly upon the transistor switching characteristics, as in resistor-transistor logics (RTL), diode-transistor logics (DTL), and transistor-transistor logics (TTL). For example, in a TTL circuit made of MOS transistors, when a signal level "High" is applied to one of the gates of two MOS transistors, an output signal "Low" is obtained. If a signal level "Low" is applied to both the gates, an output signal "High" is obtained. This logical operation is called a NAND logical operation. A circuit having such a logical operation function is generally called a gate.

A TTL circuit is excellent in its stability relative to power supply voltage, noises and the like. It is therefore widely used in an integrated circuit. In this context, the more detailed description will be given. In a TTL circuit, if an input voltage is larger than a threshold voltage of a MOS transistor, an output is raised to a power supply voltage, and if smaller than the threshold voltage, an output is 0 V. The threshold voltage is generally near 1 V, and the power supply voltage is 5 V. Therefore, by using a TTL logical circuit, a voltage difference between "Low" and "High" can be boosted from 1 V up to 5 V. Even if the power supply voltage fluctuates more or less, the output level is sufficiently higher than the threshold voltage, ensuring a reliable operation. This TTL circuit is resistant against noises of a high level up to 1 V which is not realistic in an ordinary state.

Such a TTL circuit is constructed of transistors so that the integration density is determined by work dimension of transistors. As described previously, a conventional semiconductor technique has a limit in reducing the size of transistors because of physical limits concerning depletion layer extension of p-n junctions, statistical errors, and the like. Furthermore, a conventional switching device is required to flow a predetermined amount of current in order to switch it, and a large amount of current in order to switch it at high speed. The larger the current, the more the power is consumed, raising the temperature of the device. It is common for a recent large scale integrated circuit to integrate one million gates per square cm. The power consumption per one gate is required to be suppress to one hundred-thousands-th watt or less, because of a cooling limit.

There is a limit in integration density and switching speed so long as conventional switching devices are used.

The surface structure of a substrate on which a large scale integrated circuit using switching devices is formed, has been configured by using a photolithography method. This photolithography method uses masks and is not suitable for configuring the surface structure at an atomic level, because there are limits in mask work precision and exposure ultraviolet wavelength.

SUMMARY OF THE INVENTION

The present invention provides a device having an atomic level switching function overcoming the limits of presently used devices. Namely, the present invention provides a switching device which controls the conductance of an atom wire having a plurality of atoms arranged so as to have interaction between atoms, by externally controlling the electron states of atoms of the atom wire.

The present invention provides also a logical circuit using an atomic level switching function overcoming the limits of presently used devices.

The present invention provides also a method of configuring the surface structure of a substrate by arranging a number of atoms in a short time, which method is suitable for forming on the substrate a logical circuit using an atomic level switching function.

BRIEF DESCRIPTION OF THE DRAWINGS

FIG. 20 shows an example of a decoder circuit.

FIG. 27 shows an example of the system arrangement using atom wire circuits.

DESCRIPTION OF THE PREFERRED EMBODIMENTS

Figure 1A:
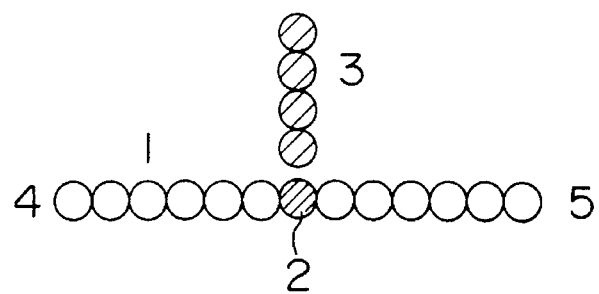
FIGS. 1A and 1B illustrate the principle of an atomic switch according to the present invention.
Figure 1B:
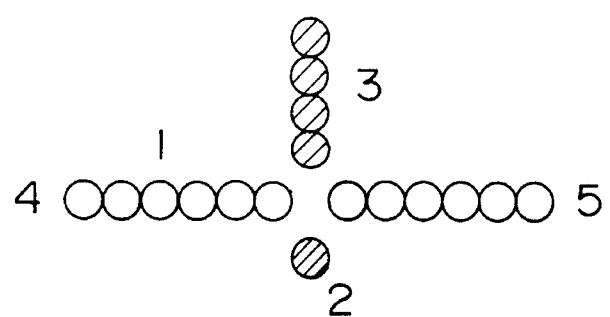

The fundamental structure of a switching device according to the present invention is shown in FIGS. 1A and 1B. This switching device is constituted by an atom wire 1, a switching atom 2, and a switching gate 3. Opposite ends of the atom wire 1 are connected to an input 4 and output 5. The switching gate 3 is connected to a switching power source. These elements are formed on the upper surface of an appropriate substrate.

As shown in FIG. 1A, a signal at the input 4 is outputted from the output 5 if the switching atom is in contact with the atom wire 1. On the other hand, as shown in FIG. 1B, if the switching atom 2 is moved to enter a non-contact state of the atom wire 1 by applying a signal from the switching power source to the switching gate 3, a signal at the input 4 will not be derived to the output 5. The structure shown in FIGS. 1A and 1B is of an extremely small atomic level switching element.

The switching time of this switching circuit is determined by the switching time of the switching gate 3. This switching time is determined by a time required for the probability of presence of electrons to exceed a threshold value, and not by a charge/discharge time of a conventional transistor. Therefore, a signal can be transmitted theoretically at the speed of light. According to the present invention, it is possible to provide extremely fast switching.

Figure 2:
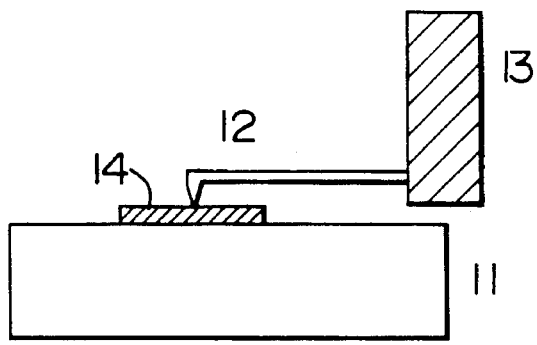
FIG. 2 is a schematic diagram showing a scanning tunnelling microscope.

Atom wires, switching gates, and switching atoms of the present invention can be realized, for example, by using a scanning tunnelling microscope (STM) such as shown in FIG. 2. An STM is constituted by a substrate transporting mechanism 11, a probe 12, and an x-axis operation detecting mechanism 13. A substrate 14 is placed on the substrate scanning mechanism 11 and the probe 12 is scanned to detect the atomic level irregularity on the surface of the substrate 14, as well known in the art. Instead of the STM, an Atomic Force Microscope AFM having a similar structure and function can be used.

With the above-described structure of STM, it is possible to attract an atom on the substrate 14 to the probe 12 side or to move the atom to the substrate 14 side, by changing the potential applied to the probe 12. An atom on the substrate 14 is generally charged positive. Therefore, when a negative potential is applied to the probe 12, an atom is attracted to the probe 12, and when a positive potential is applied to the probe 12, an atom is displaced from the probe 12 and placed on the substrate 14. An atom wire can therefore be formed from a predetermined number and type of atoms aligned on predetermined locations on the surface of the substrate 14, by repeating the following operations: first a necessary number and type of atoms are placed on the surface of the substrate 14; the location and type of each atom are detected using the function of STM; an atom of a desired type is picked up by the probe 12 by controlling a bias applied to the probe 12 to a proper value; the probe 12 in this state is moved to a predetermined location; and the atom is placed on this location by changing the bias applied to the probe 12.

In order to place a necessary type and number of atoms on the surface of the substrate 14, an atom layer such as a ¹/₁₀ mono-layer or so having a necessary number of atoms or more is formed by an evaporation method, sputtering method, or the like. In order to provide a plurality type of atoms, atoms with a desired number of types are deposited one upon another. After an atom layer containing a necessary type and number of atoms of atoms is formed, the locations of atoms are measured in the STM mode, and atoms are placed on the surface of the substrate 14 at desired locations by using the above-described method.

A method of moving an atom is not necessarily limited only to the above-described method. For example, an atom may be slid or rolled on the surface of the substrate by the probe 12 to move it to a desired location.

The shape of the atom wire is not necessarily only a straight line. For example, for elements having a bonding state of strong directivity, an atom wire may sometimes be more stable if it has a zigzag shape. Also in some cases, a shape of an atom wire formed by a series of unit structures each having a plurality of atoms bonded in a ring or by a combination of a plurality of different unit structures, may be more effective. The number of switching atoms is not limited to one, but a plurality of atoms may be moved at the same time, or if necessary, at different times and in different spaces. Switching atoms may take a ring structure or spherical structure. In this case, it is obvious that the structure of the switching gate corresponds to the structure of switching atoms. A guide may be used effectively for regulating the switching atom to move in a predetermined direction.

As shown in FIGS. 1A and 1B, in order to practice the present invention, it is necessary to use two types of atoms, one type being atoms constituting the atom wire and switching gate portion stationary on the surface of the substrate, and the other type being a switching atom or atoms movable on the surface of the substrate 14. In the present invention, as the substrate 14 for forming an atom wire, a silicon wafer with a silicon oxide film grown was used. In the embodiment of the present invention, a desired performance of a switching device was obtained by using atoms having a large interaction energy with the surface of the substrate 14, for example, silicon atoms, for forming an atom wire and switching gate, and atoms having a small interaction energy, for example, gold atoms, for the switching atom or atoms. Although one switching atom is shown, a plurality of atoms can be used.

The type of atoms can be selected, as described above, depending upon the degree of interaction with a substrate surface. Since the interaction changes also as a function of temperature, the type of suitable atoms for a rated temperature range changes. In this embodiment, the temperature of the substrate 14 was controlled to 40 K to realize the structure of the switching device shown in FIGS. 1A and 1B. The substrate temperature may take various values from 1 K or lower to about a room temperature, depending upon the types of a substrate, atoms of an atom wire, and switching atom or atoms. The potential to be applied to the switching gate is sufficient if it can move the switching atom. In this embodiment, the switching atom or atoms could be moved sufficiently at the potential of 0.01 V. The higher the potential, the faster the motion speed of the switching atom and the faster the circuit operation. However, if the potential is too high, unnecessary or excessive motion of the switching atom may occur resulting in a malfunction of the switching device. Therefore, the lower potential is more effective from the view point of circuit operation.

Switching devices disclosed by the present invention require no ground potential, unlike conventional semiconductor circuits, and can be simplified in structure. Furthermore, as will become apparent from the following embodiments, complicated logic arrangements can be realized using a simple circuit configuration suitable for large scale integration and high integration degree. More particularly, circuits and circuit configurations will be given below by way of example.

Figure 3A:
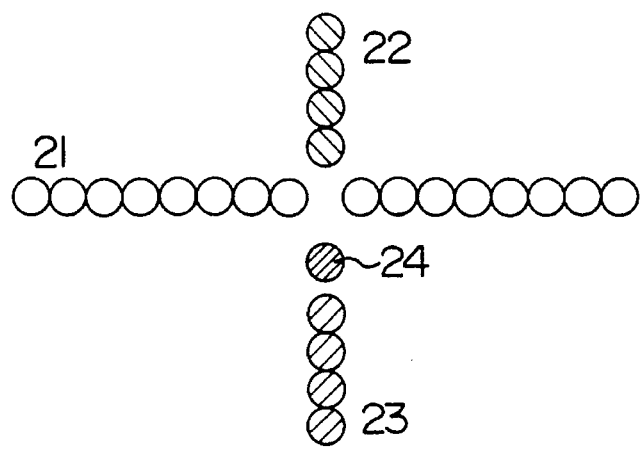
FIGS. 3A to 3C are diagrams showing examples of switching gates using atomic switches.
Figure 3B:
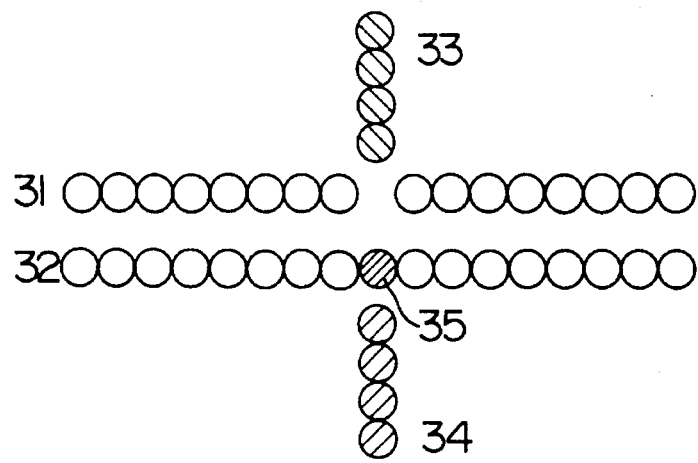
Figure 3C:
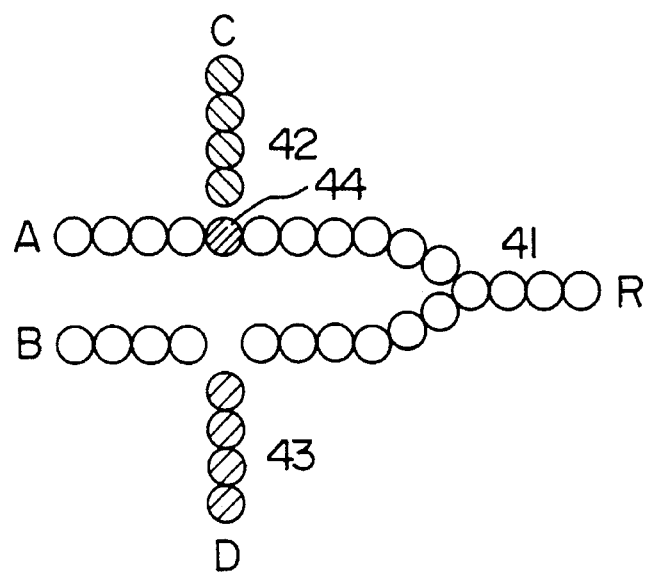

The structures of switching gates are shown in FIGS. 3A, 3B, and 3C. Some examples of switching gates using switching devices are shown, other variations are also possible.

The switching device shown in FIG. 3A is constituted by an atom wire 21, switching gates 22 and 23, and a switching atom or atoms 24. FIG. 3A shows a non-conductive state of the atom wire 21 changed from a conductive state by applying a potential to the switching gate 22 to move the switching atom 24. To return to the conductive state of the atom wire 21, another potential is applied to the switching gate 23 to move the switching atom 23 into the atom wire 21.

The circuit shown in FIG. 3A is a reset gate circuit in which an input from the preceding stage is applied to the switching gate 22 to process a signal, and thereafter a reset pulse is applied to the switching gate to return to the initial state. Any type of circuits can be realized using such a circuit structure as a basic structure. Therefore, a combination of such circuits can realize principally any type of circuits.

The switching device shown in FIG. 3B is constituted by atom wires 31 and 32, switching gates 33 and 34, and a switching atom or atoms 35. FIG. 3B shows a non-conductive state of the atom wire 31 and a conductive state of the atom wire 32 when applying a potential to the switching gate 33 to move the switching atom or atoms 35. When another potential is applied to the switching gate 34, the atom wire 31 enters the conductive state and the atom wire 32 enters the non-conductive state.

FIG. 3C shows the switching device with an atom wire having a branch. This switching device is constituted by an atom wire 41 with a branch, switching gates 42 and 43, and a switching atom or atoms 44. FIG. 3C shows a non-conductive state of the atom wire on the switching gate 42 side and a conductive state of the atom wire on the switching gate 43 side when applying a potential to the switching gate 42. Representing the inputs to the atom wire 41 by A and B and the inputs to the switching gates 42 and 43 by C and D, an output R of the atom wire 41 can be given by:

$$R = A*C' + B*D'$$

Using the above circuits of very simple structure, sophisticated logical circuits can be realized. Therefore, circuits using such switching devices are very effective in realizing high performance computers.

An embodiment of atom wires intersecting each other, which intersection fills an important role in circuit structure, will be described with reference to FIG. 4. The electric field generated by electrons of an atom or atoms gives some influence to an atom wire adjacent the atom. The maximum distance within which the atom gives some influence is in the order of one atom. Therefore, if two atom wires are spaced apart more than this maximum distance, interaction between two atom wires becomes negligible. Therefore, if atom wires are to be intersected, a circuit structure is used which allows at least one atom distance between atom wires.

Figure 4:
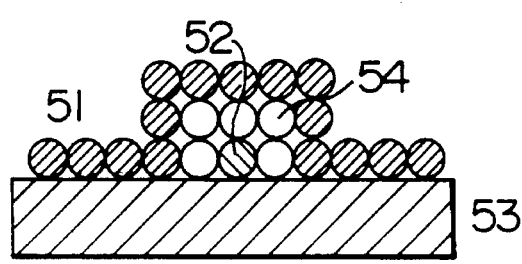
FIG. 4 illustrates an example of a method of realizing atom wires intersected each other.

As shown in FIG. 4, first and second atom wires 51 and 52 made of tungsten atoms are formed on a substrate 53. An oxygen atom layer 54 is formed as interlayer insulating atoms on the first atom wire 51, to electrically insulating the first atom wire 51 from the second atom wire 52. If a substrate with a silicon oxide film is used for forming atom wires, oxygens contained in the oxide film may be used as interlayer insulating oxygen atoms. The interlayer insulating layer is not limited only to the oxygen atom layer 54, but other insulating material such as nitrogen, rare gas, and other atoms may also be used. The thickness of the oxygen atom layer 54 corresponding to one to two atoms is sufficient for making the interaction between the atom wires 51 and 52 negligibly small. The switching device using the atom wires 51 and 52 showed a normal operation without being influenced by the intersection.

Figure 5A:
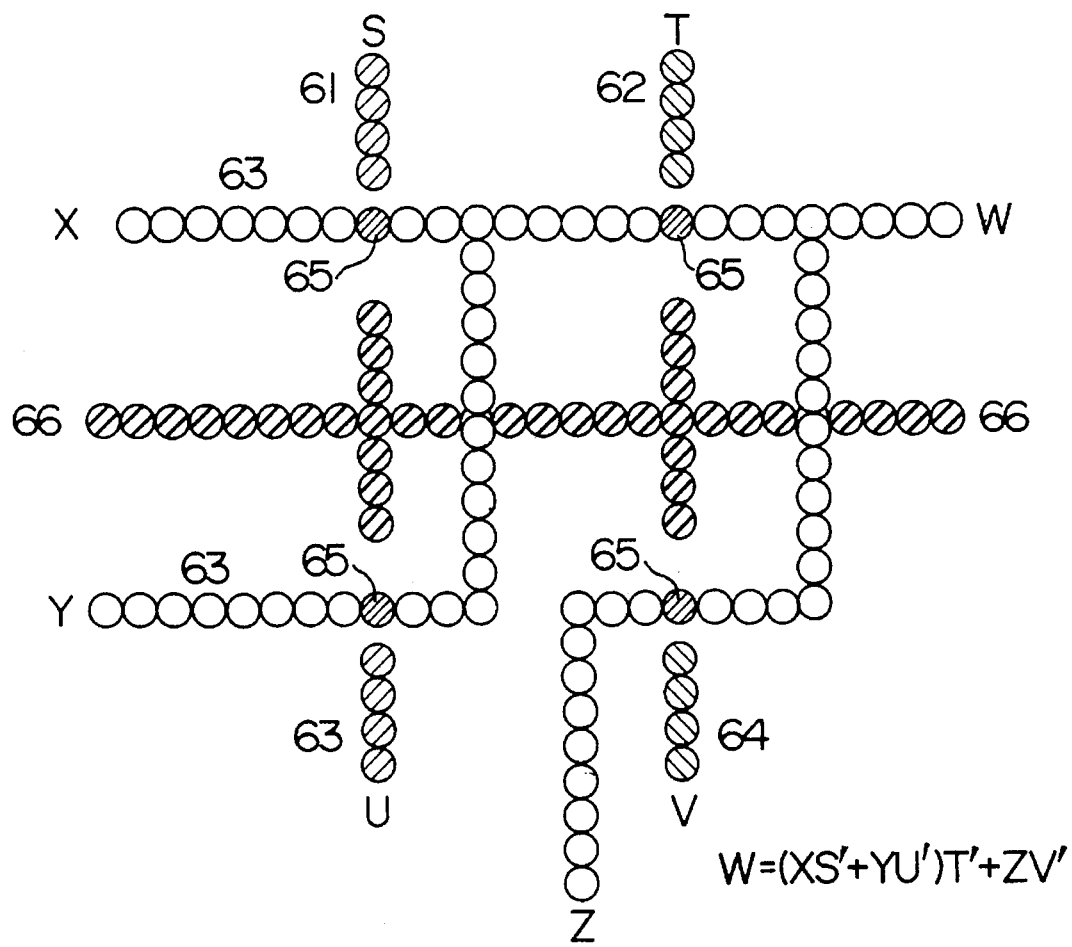
FIGS. 5A and 5B show examples of sophisticated logical circuit and inverter.
Figure 5B:
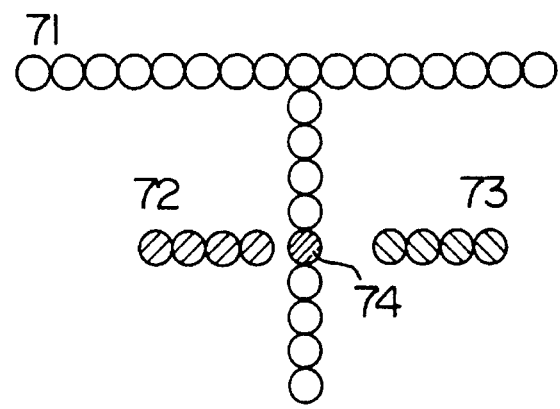

FIGS. 5A and 5B show embodiments of another logical circuit and inverter.

FIG. 5A shows an example of a sophisticated logical circuit constituted by an atom wire 63, switching gates 61, 62, 63, and 64, a switching atom 65, and a reset circuit 66. Representing the inputs to the atom wire by X, Y, and Z and the inputs to the switching gates by S, T, U, and V, the output W is given by:

$$W=(X*S'+Y*U')*T'+Z*V'$$

As appreciated from this embodiment, a complicated logical circuit can be realized by a simple circuit, providing highly advantageous effects of the present invention.

FIG. 5B illustrates an embodiment of a method of forming an inverter. This inverter is constituted by an atom wire 71, a switching gate 72, a reset circuit 73, and a switching atom 74. A signal G inputted from the switching gate 72 is inverted and outputted as an output H, with a power supply voltage being applied to the atom wire 71. For example, if an input to the switching gate 72 is "High", an output "Low" is derived, or vice versa. The whole circuit can be synchronized with an input of a reset pulse, realizing this circuit with a simple structure. The whole system of a computer of the state-of-the-art is synchronized with an input of an external clock pulse. Accordingly, switching device logical circuits having built-in reset circuits of this embodiment can be readily used as logical circuits of large scale computers.

Next, an embodiment of an atom wire FET using a switching device of the present invention will be described.

Figure 6:
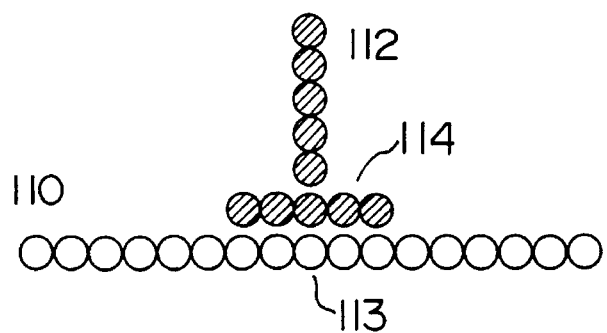
FIG. 6 illustrates an embodiment of an atom wire FET switching device according to the present invention.

As shown in FIG. 6, an atom wire FET is constituted by an atom wire 110 and a switching gate 110 made of an atom wire arranged near the atom wire 110. The wave function of a fraction 113 of the atom wire 110 corresponding in position to a fraction 114 of the switching gate 112 interacting with the atom wire 110, changes with a bias of a proper amplitude applied to the switching gate 112. As a result, the conductance of the atom wire 110 changes correspondingly. The conductance of the atom wire 110 generally lowers when applying a bias to the switching gate 112 and changing the wave function of the atom wire 110.

In this way, the on/off of the atom wire 110 is controlled by a bias to the switching gate 112.

In FIG. 6, the type of atoms of the switching gate 112 is shown different from the type of atoms of the atom wire 110, discriminating with or without hatching. The same type of atoms may be used for both the switching gate 112 and atom wire 110, without any significant difference of operation. However, in general, the performance of an atom wire can be improved by using one type of atoms for one atom wire and another type of atoms for another atom wire, because there occurs no interference between wave functions.

The distances between atoms constituting an atom wire and atoms constituting a switching gate determine the interaction between the atom wire and switching gate. It is therefore necessary to control the distance strictly. In this embodiment, silicon atoms were used for both the atom wire and switching gate. Silicon of bulk crystal is a semiconductor. However, an atom wire of silicon atoms provides a metallic conduction mechanism. Other atoms may also be used if they provide a metallic conduction in an atom wire structure.

In this embodiment, the distance between the atom wire 110 and switching gate 112 was set to 1.8 times the distance of silicon crystal atoms, corresponding to the distance between atoms of the atom wire and switching gate 0.8 times the distance of silicon crystal atoms. Obviously, the distance between the atom wire and switching gate is not limited to 1.8 times. Actual measurements showed that the interaction became large if the distance is set shorter than 1.8 times, and short if it is set longer than 1.8 times.

If the distance between the atom wire and switching gate is 1.1 times the silicon crystal atom distance or shorter, the interaction becomes too large to the extent that the atom wire and switching gate are conducted each other, no more providing the operation as the switching device. If the distance is 4.8 times or longer, the interaction becomes too small, no more providing the operation as the switching device.

Five atoms of the switching gate are arranged near and in parallel with the atom wire, in the embodiment shown in FIG. 6. The number of such atoms is substantially arbitrary. However, if the number is large, e.g., several tens, too large an interaction lowers the switching performance. Under the ordinary operation conditions, one to five atoms are appropriate.

Figure 7:
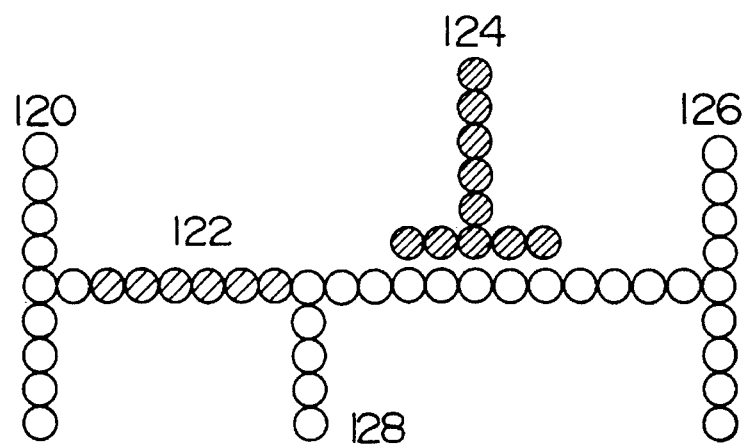
FIG. 7 shows an embodiment of a signal inverter using an atom wire FET switching device.

An example of a functional circuit using an atom wire FET is shown in FIG. 7. This embodiment provides an example of a signal converter using an atom wire FET. A signal inputted via an input terminal 124 is converted to a power supply level signal by a signal converter constituted by an atom wire 120 connected to a power supply level, an atom wire 122 functioning as a resistor, and an atom wire 126 connected to a ground level. For example, if an input signal "High" is supplied, an atom wire FET operating on a fraction of atoms of the atom wire 126 connected to the ground level is interacted with the gate input and the atom wire FET turns off, so that a power supply level "High" signal is outputted from an output 128. On the other hand, if an input signal "Low" is supplied, the atom wire FET operating on a fraction of atoms of the gate atom wire 126 connected to the ground level remains turned on, so that a ground level "Low" signal is outputted. Using the circuit shown in FIG. 7, an input signal can be converted to the power supply level or ground level.

Figure 8:
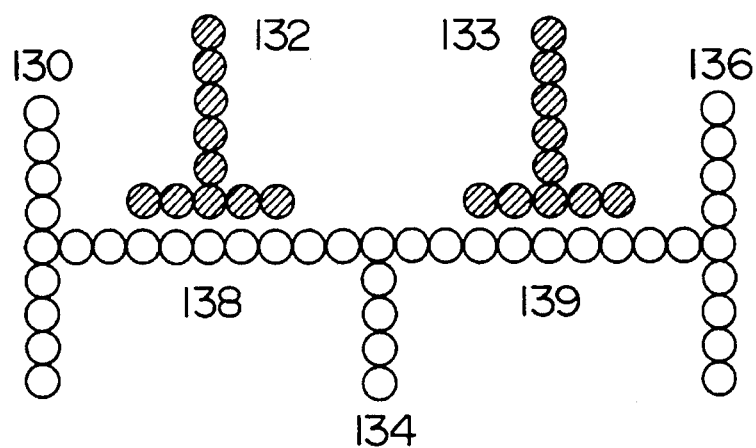
FIG. 8 shows an example of a logical circuit using an atom wire FET switching device.

FIG. 8 shows another example of an input converter circuit. This circuit is constituted by an atom wire 130 connected to a power supply level, an atom wire 136 connected to the ground level, and atom wire FETs 138 and 139 having respective input terminals 132 and 133, one ends thereof being connected to the atom wires 130 and 136 and the other ends being connected in common to an output terminal 134. If the input terminal 132 of the atom wire FET 138 is "High" and the input terminal 133 of the atom wire FET 139 is "Low", a ground level signal is outputted from the output terminal 134. On the other hand, if the input terminal 132 of the atom wire FET 138 is "Low" and the input terminal 133 of the atom wire FET 139 is "High", a power supply level signal is outputted. If a "High" or "Low" signal is inputted to both the atom wire FETs 138 and 139, an output cannot be determined unconditionally. Such inputs are therefore meaningless.

The output of an input converter circuit having three or more atom wire FETs connected in series can be determined in a similar manner described above.

Figure 9:
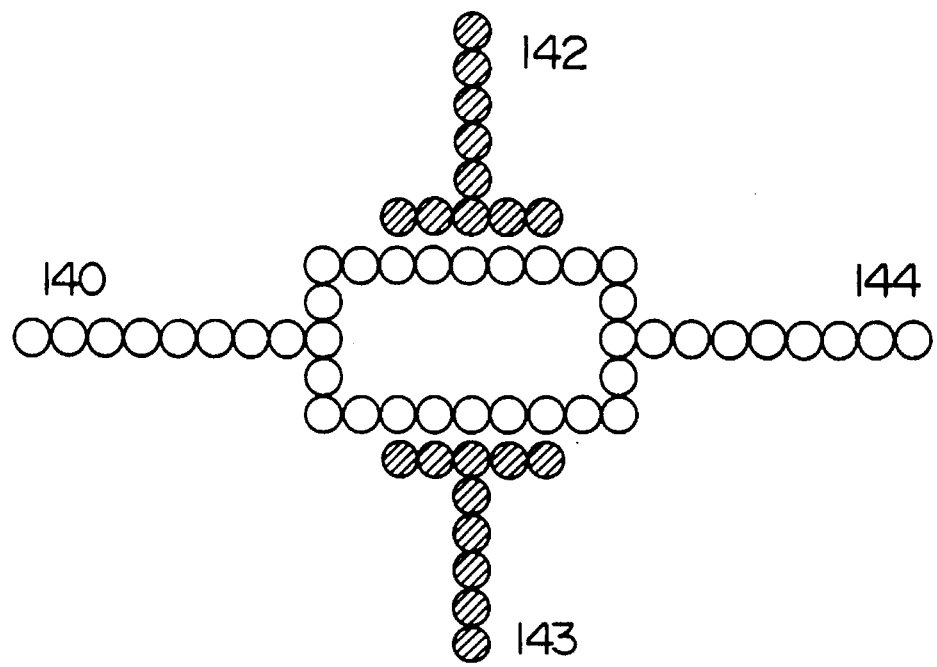
FIG. 9 shows an example of a NAND logical circuit using an atom wire FET switching device.

FIG. 9 shows an example of a logical circuit constituted by an input terminal 140, an output terminal 144, and atom wire FETs connected in parallel between the input and output terminals 140 and 144 and having independent signal terminals 142 and 143. If the input signals to the signal terminals 142 and 143 of the atom wire FETs are both "High", the signal path between the input and output terminals 140 and 144 turns off and so an output signal remains unchanged. If at least one of the signals at the signal terminals 142 and 143 is "Low", the signal path between the input and output terminal 140 and 144 turns on and so a signal at the input terminal is outputted from the output terminal. In a circuit having three or more atom wire FETs connected in parallel and having three or more signal terminals, a signal at the input terminal is outputted from the output terminal if at least one of the input signals at the signal terminals is "Low". This circuit can be considered as a kind of a NAND circuit.

Figure 10:
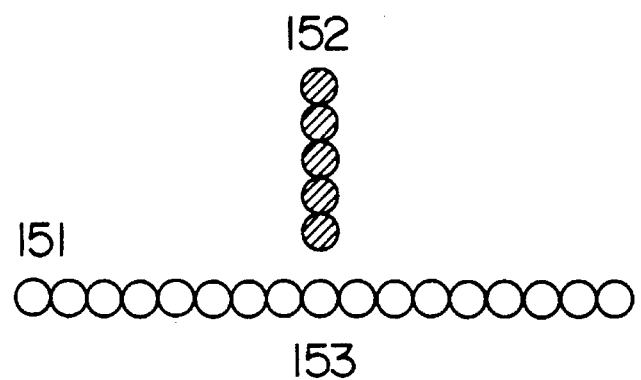
FIG. 10 shows an example of an improved structure of a switching gate of an atom wire FET switching device.

An example of another structure of an atom wire FET will be described with reference to FIG. 10. An atom wire 152 as a switching gate is provided for an atom wire 151. When comparing with the atom wire FET shown in FIG. 6, it can be seen that the structure of the switching gate 152 is considerably different. Particularly, in the atom wire FET shown in FIG. 6, a plurality of atoms of the switching gate are arranged in a line spaced apart from the atom wire by a predetermined distance, and a bias applied to the switching gate is transferred to the atom wire because of the interaction by the plurality of atoms. On the other hand, a bias applied to the switching gate shown in FIG. 10 is transferred from substantially one switching gate atom to the atom wire. In the embodiment shown in FIG. 10, although the number of atoms 153 to be influenced by the electric field of the switching gate 152 is much less than that of the embodiment shown in FIG. 6, even such a small number of atoms of sufficient for changing the conductance of the atom wire 151.

It is generally possible to change the conductance of an atom wire if the number of switching gate atoms is one or more. In this context, it is obvious that the essential condition of switching operation is a sufficiently short distance between the switching gate 152 and atom wire 151, because the distance therebetween determines the degree of interaction.

Generally, the distance 1.2 to 2.5 times the equilibrium atom distance is appropriate. The shorter the distance, the larger the interaction and the more an electron wave leaks from the switching gate 152 to the atom wire 151. On the other hand, the longer the distance, the smaller the interaction and the smaller the change of the conductance of the atom wire to be caused by a bias applied to the switching gate.

Figure 11:
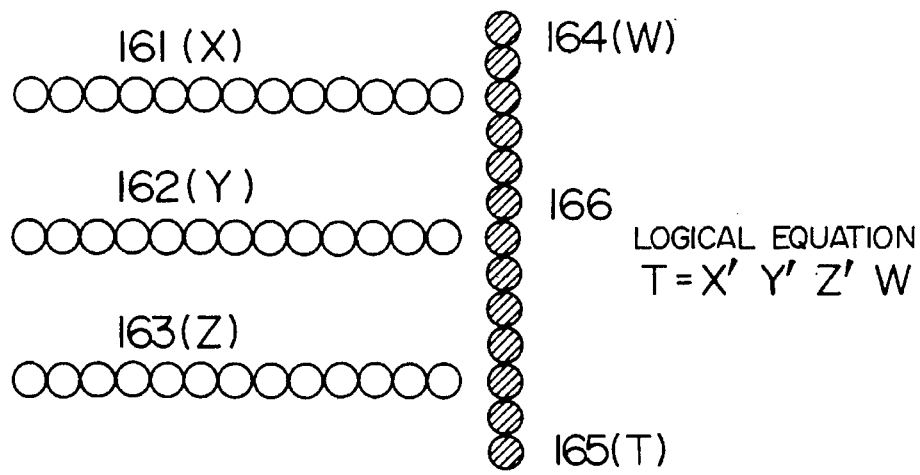
FIG. 11 shows an example of a NOR logical gate using an atom wire FET switching device.

Examples of various logical circuits using atom wire FETs will be explained. FIG. 11 shows the structure of a logical gate in which between an input 164 and output 165 of an atom wire 166, switching gates 161, 162, and 163 of the type described with FIG. 10 are disposed. In this embodiment, a signal level (T) at the output 165 is given by the following expression, representing the signal level at the input 165 by (W) and levels at the switching gates by (X), (Y), and (Z):

$$T = X'*Y'*Z'*W$$

The structure of the logical circuit shown in FIG. 11 realizes a kind of a NOR gate.

Figure 12:
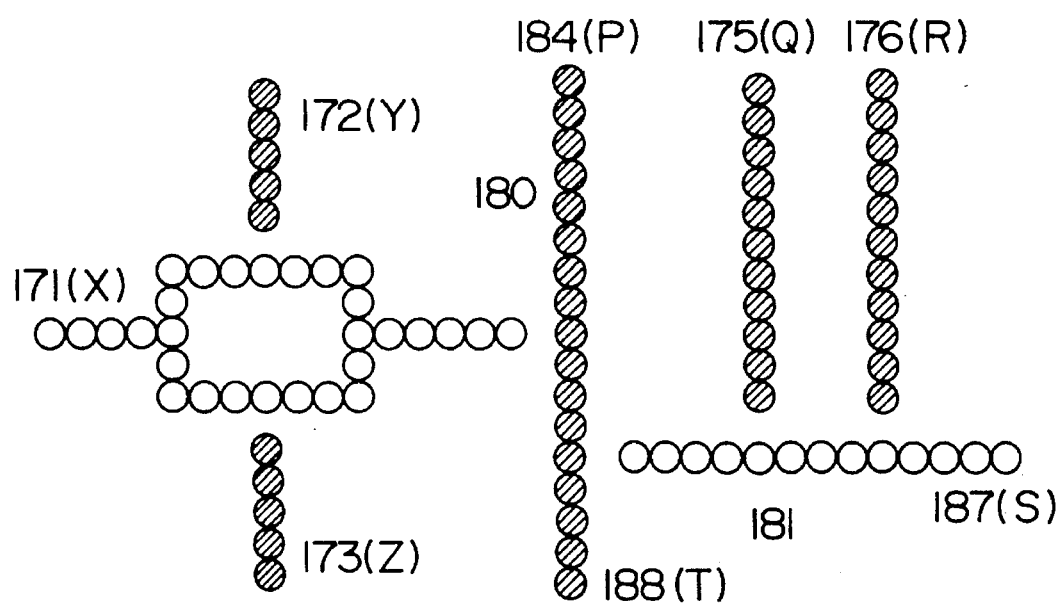
FIG. 12 shows an example of a complicated logical circuit using an atom wire FET switching device.

FIG. 12 illustrates a method of realizing a logical gate constituted by a combination of a NAND gate and NOR gate described above. With the similar structure described with FIG. 9, an input 171 (X) is controlled by signals applied to input gate terminals 172 (Y) and 173 (Z) of two atom wire FETs, and with the similar structure described with FIG. 11, an atom wire 181 is controlled by signals 175 (G) and 176 (R) supplied from two atom wires. An atom wire 180 is controlled by signals from the two circuits. Representing the inputs to the atom wires 180 and 181 by 184 (P) and 187 (S), the output 188 (T) of the atom wire 180 can be given by:

$$T = P\{X(Y'+X')\}'*\{R'*Q'*S\}'$$

As seen from this embodiment, even a complicated equation can be realized by a combination of atom wire FETs.

Figure 19A:
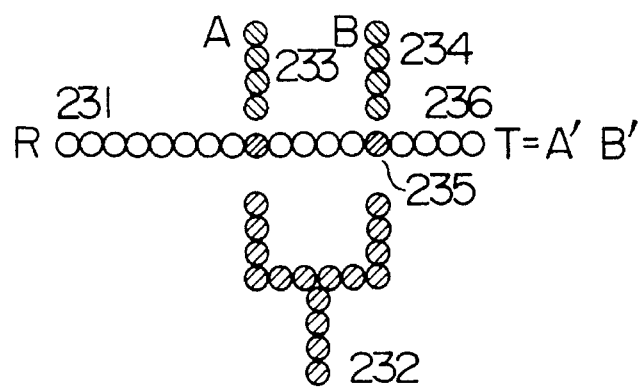
FIGS. 19A to 19D show examples of the structures of fundamental logical circuits such as NAND and NOR.

Next, examples of fundamental structures of logical circuits such as NAND and NOR will be described. The circuit shown in FIG. 19A is constituted by gates 233 and 244, an input 231, an output 236, a reset gate 232, and a switching atom 235. When signals A and B are applied to the gates 233 and 234, a signal A'*B' is derived at the output 236. This is a NOR gate. Only when a "Low" signal is inputted to both the gates 233 and 234, a "High" signal is derived at the output 236. When a signal is applied to the reset gate after a signal is transferred to perform a logical operation, the logical circuit is reset to the initial state, allowing the next logical operation. Namely, the reset signal can be used as a synchronizing signal.

Figure 19B:
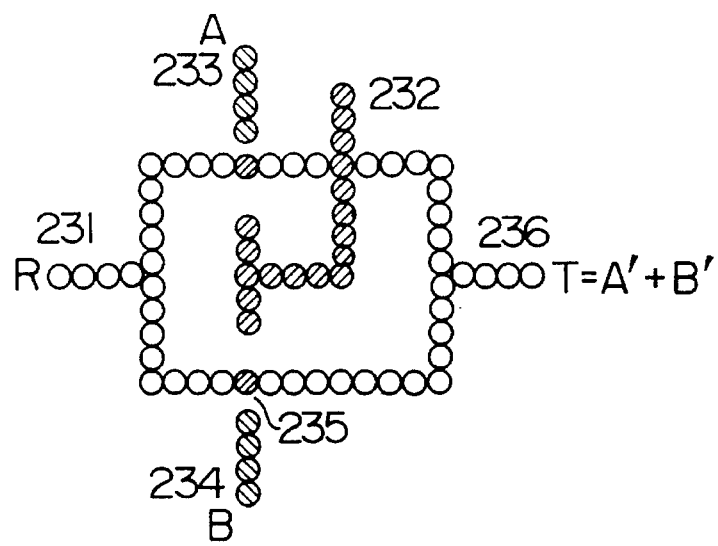

FIG. 19B shows a logical circuit constituted by an input 231, gates 233 and 234, a reset gate 232, an output 236, and a switching atom 235. When signals A and B are applied to the gates 233 and 234, a signal A'+B' is derived at the output 236. This is a NAND gate. When a "Low" signal is inputted to one of the gates 233 and 234, a "High" signal is outputted. In other words, only when a "High" signal is applied to both the gates 233 and 234, a "Low" signal is outputted.

Figure 19C:
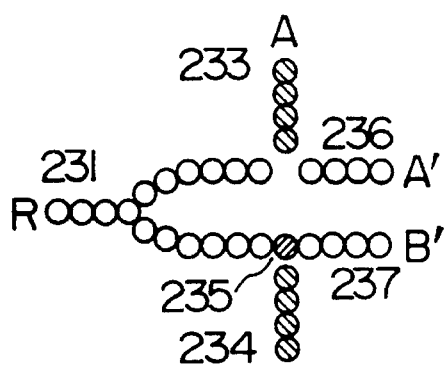

FIG. 19C shows an example of a NOT circuit constituted by an input 231, gates 233 and 234. When signals A and B are applied to the gates 233 and 234, signals A' and B' are derived at outputs 236 and 237. This is a NOT circuit. Instead of the input signals A and B, if information A and A' of inverted information is inputted, A' and A are outputted, providing a NOT circuit filling an important role of a logical circuit. If a reset gate 232 is provided in correspondence with the gates 233 and 234, this circuit can be used as a synchronizing type NOT operation circuit synchronizing with a reset signal.

Figure 19D:
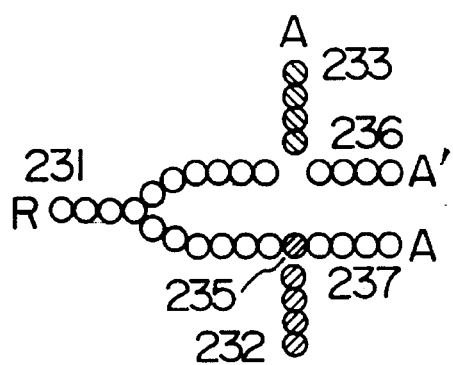

FIG. 19D shows an example of an inverted information output circuit. When information A is supplied to a gate 233 with a "High" being always inputted to an input 231, A' and A are derived at outputs 236 and 237. Inverted information can be outputted at a timing given by a reset gate 232.

Next, a decoder circuit will be described. FIG. 20 shows a decoder circuit constituted by a power supply line 241, select lines 242, 243, and 244, a reset gate 245, and a switching atom 246. This decoder circuit outputs power supply level signals at outputs 247 in accordance with the information supplied to the select lines 242, 243, and 244. With this circuit structure, n select lines can select output lines equal to 2 raised to the power of n. Additional circuits may be used for providing an improved stability of this decoder, such circuits including circuits using pairs of outputs of the NOT circuits shown in FIG. 19C as select lines, circuits providing a reset gate to each switching device, and so on. By using this decoder circuit, it becomes possible to select a desired one of bits in a memory cell array, allowing to configure a random access memory. It is principally possible to drive outputs line greater in number than that of select lines.

Figure 21A:
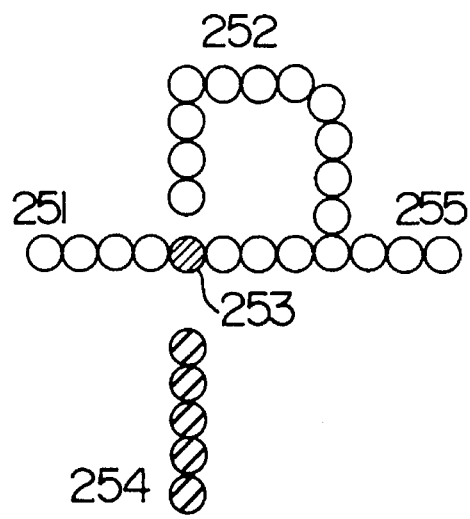
FIGS. 21A and 21B show an example of a self switching circuit.
Figure 21B:
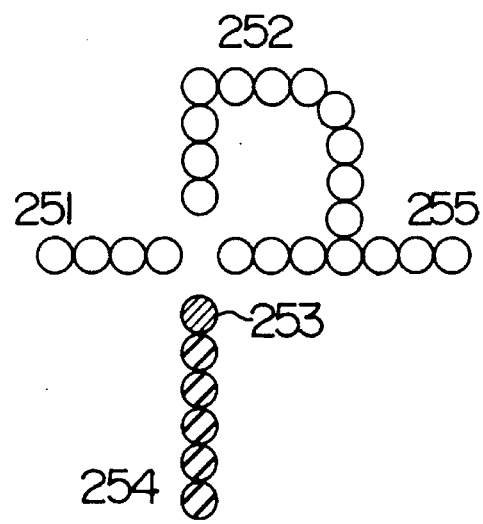

Next, an example of a self switching circuit, and a memory using the self switching circuit will be described. FIG. 21A shows an example of a self switching circuit constituted by an input 251, a charge accumulator 252, a switching atom 253, a reset gate 254, and an output 255. When a signal is applied to the input 251, an electric field is applied from the charge accumulator 252 to the switching atom 253. As a result, as shown in FIG. 21B, the switching atom moves to turn off the gate. With this structure, when a reset signal is applied to the reset gate, the switching atom returns to the initial position to turn on the gate to output data accumulated in the accumulator from the input 251. If the self switching circuit is not configured in a close structure and the output 255 is provided, an input signal is outputted from the output 255 and the switching gate is turned off. Therefore, the next input signal will not enter the self switching circuit. The self switching circuit can be operated therefore as a pulse counter.

Figure 21C:
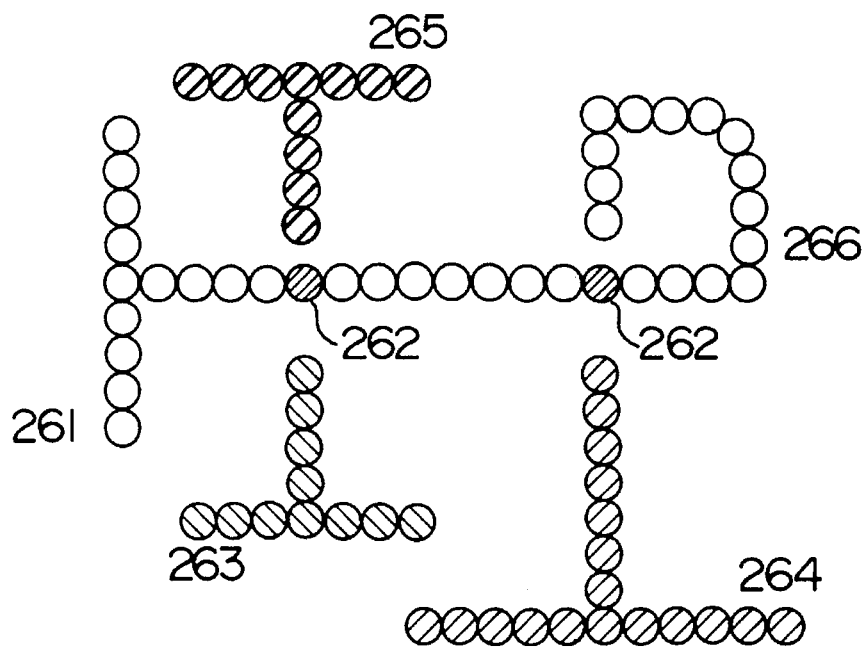
FIG. 21C shows an example of a memory cell circuit using a self switching circuit.

FIG. 21C shows an example of a memory using such a self switching circuit, constituted by a data line 261, switching atoms 262, a read gate 263, a write gate 264, a reset gate 265, and a self switching circuit 266. In writing data, the read and write gates 263 and 264 are activated at the same time while applying an information signal to the data line 261. The information signal is then stored in the self switching circuit 266. If the information signal is "High", the switching atoms 262 move away from the atom wire at the same time, so that the self switching circuit turns off. If the information signal is "Low", the switching atoms 262 will not move and the self switching circuit remains turned on. At this time, when a reset signal is applied to the reset gate 265, the information remains stored in the self switching circuit 266. In reading information stored in the self switching circuit 266, electric fields are applied to the read and write gates 263 and 264 at the same time to move the switching atoms and make conductive the atom wire constituting the self switching circuit. The information stored in the self switching circuit 266 is transferred via the data line 261 to a sense amplifier to complete the data read operation.

Figure 22:
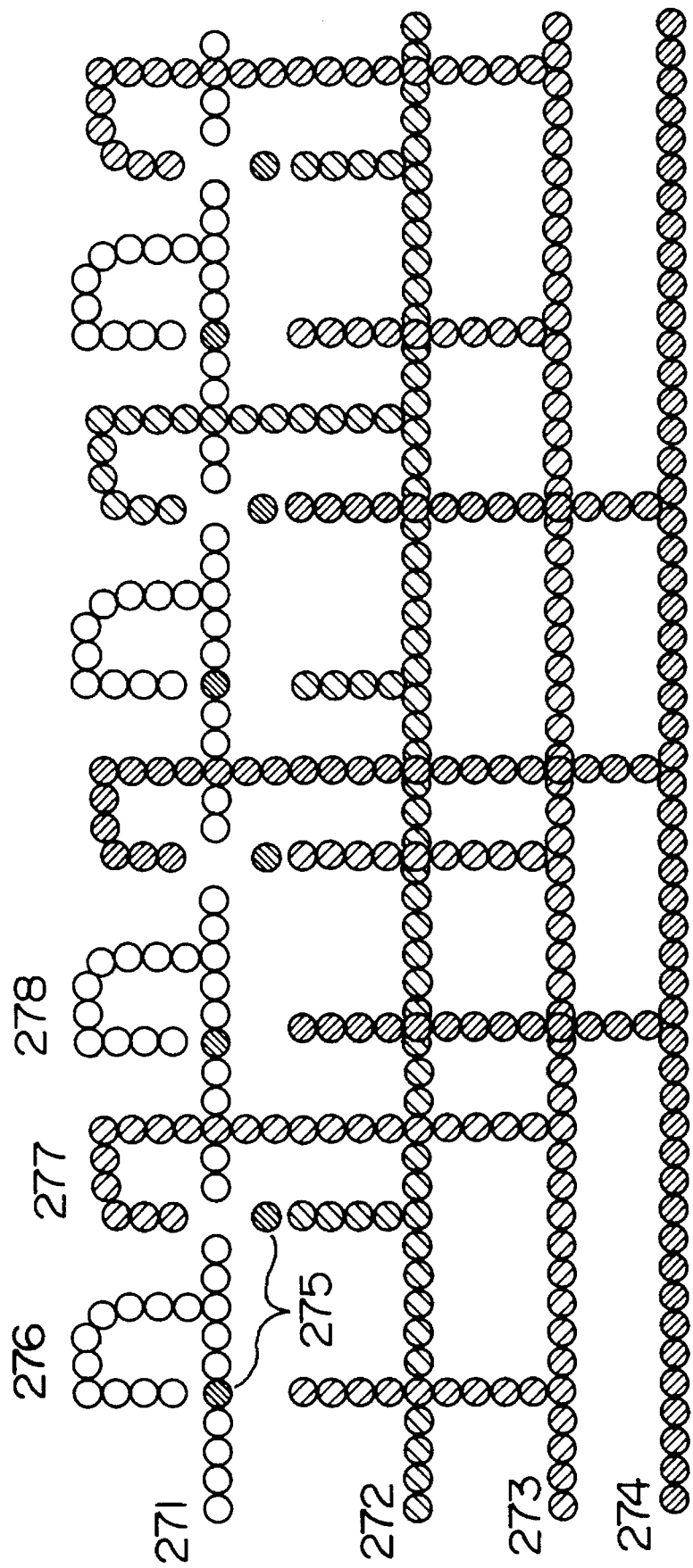
FIG. 22 shows an example of a charge transfer device circuit.

FIG. 22 shows an example of a charge transfer circuit using self switching circuits, constituted by a charge transfer line 271, clock lines 272, 273, and 274, switching atoms 275, clock gates 277, and self switching circuits 276, 278. With this circuit structure, when a "High" signal is inputted to the charge transfer line 271, the switching atom 275 of the self switching circuit 276 moves away to turn it off and make the self switching circuit 276 have a "High" level. When a clock signal is applied to the clock line 272, the "high" charge stored in the self switching circuit 276 transfers over the charge transfer line 271 to the next stage self switching circuit 278. If the input signal is "Low", the switching atom will not move. The above operations are repeated to sequentially switch the self switching circuits, so that charges can be transferred one stage after another in the charge transfer circuit. In this embodiment, three clock lines are shown. The stable operation can be obtained essentially if the number of clock lines is three or more. Particularly, the operation characteristic with a broad margin can be obtained using three or four clock lines. Clock lines are used to synchronize the whole circuit. According to this embodiment, a charge transfer circuit capable of providing an extremely high speed operation can be realized using self switching circuits. This circuit can be used not only as a data transfer line, but also as a shift register for extremely high speed computers.

Figure 23:
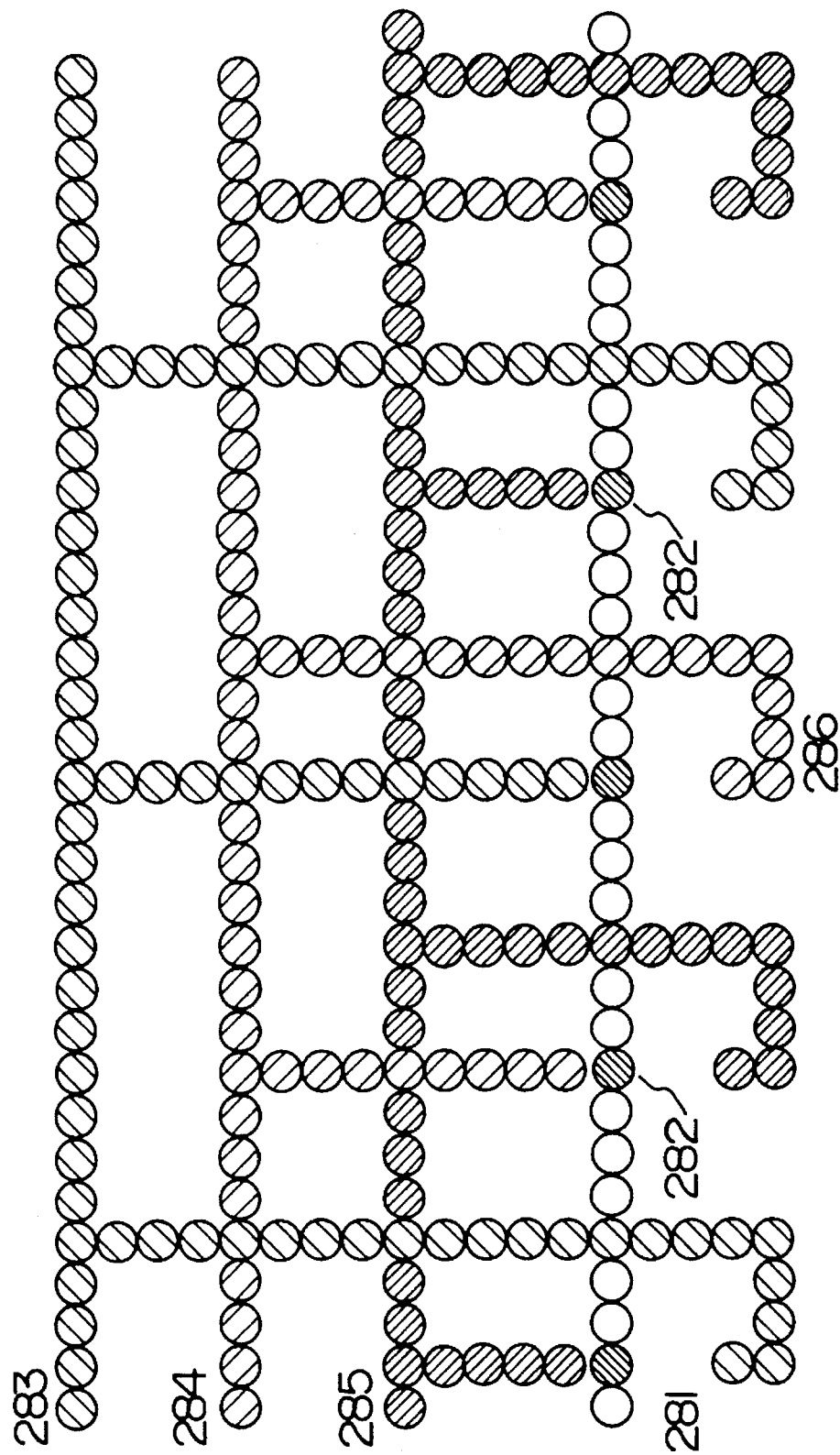
FIG. 23 shows another example of a charge transfer device circuit.

FIG. 23 shows another example of a charge transfer circuit constituted by a charge transfer line 281, clock lines 283, 284, and 285, and switching atoms 282. A signal inputted to the charge transfer line 281 is stored on the charge transfer line 281 between switching atoms 282 and sequentially transferred in the charge transfer line 281 in response to signals alternately applied to the clock lines 283, 284, and 285. A charge transfer circuit can thus be configured using only atomic switches. Similar to the embodiment shown in FIG. 22, this circuit may be used as a shift register for extremely high speed computers.

Figure 24:
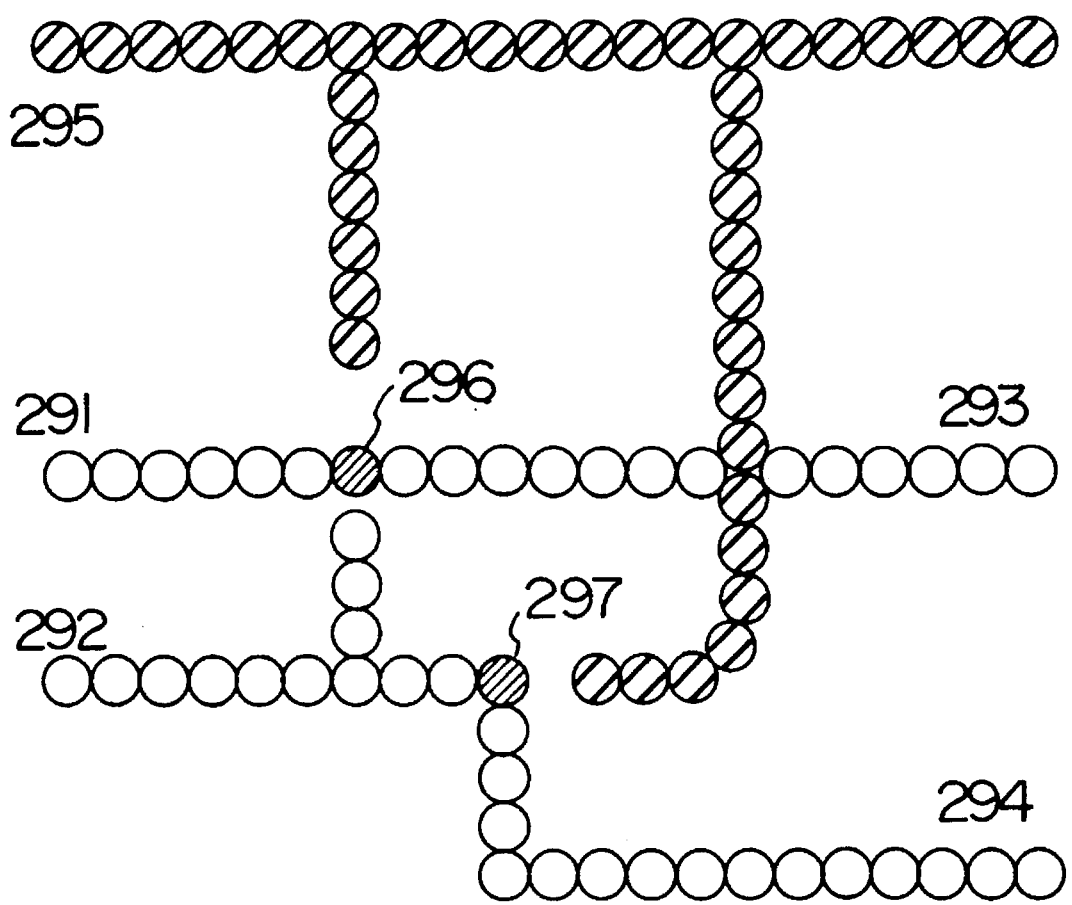
FIG. 24 shows an example of a logical circuit made of a combination of self switching circuits.

Next, the structure of a pulse circuit using atomic switches will be described. A pulse circuit shown in FIG. 24 is constituted by inputs 291 and 292, outputs 293 and 294, a reset line 295, and switching atoms 296 and 297. With this circuit structure, when a "High" signal is inputted to the inputs 291 and 292, the electric fields cause the switching atoms 296 and 297 to move away, so that a "Low" signal is outputted from the outputs 293 and 294. Representing inputs to the inputs 291 and 292 by A and B, A*B' is outputted from the output 293 and a "Low" level is always outputted from the output 294. It is possible to use combined logical circuits and provide pulse operations as shown in this embodiment.

Next, a memory circuit using atomic switches will be described.

Figure 25:
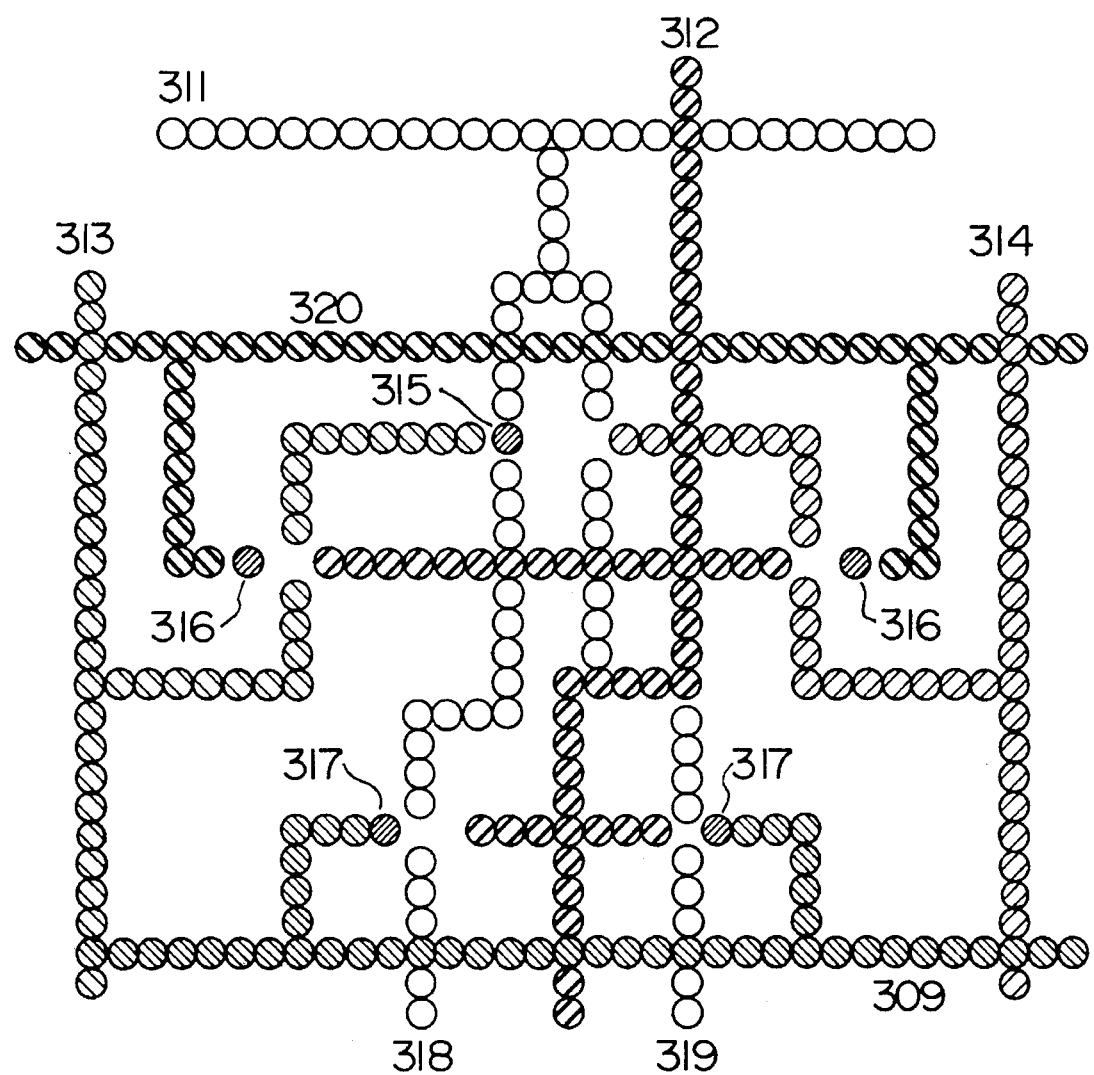
FIG. 25 shows an example of a memory cell circuit.
Figure 26A:
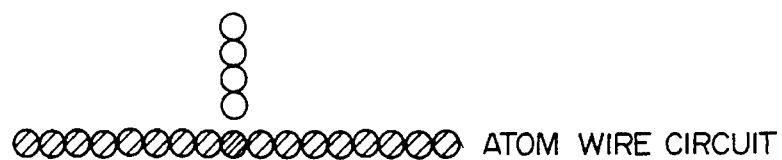
FIGS. 26A to 26E are schematic diagrams illustrating the size comparison starting from an atom wire circuit to a man-machine interface.
Figure 26B:
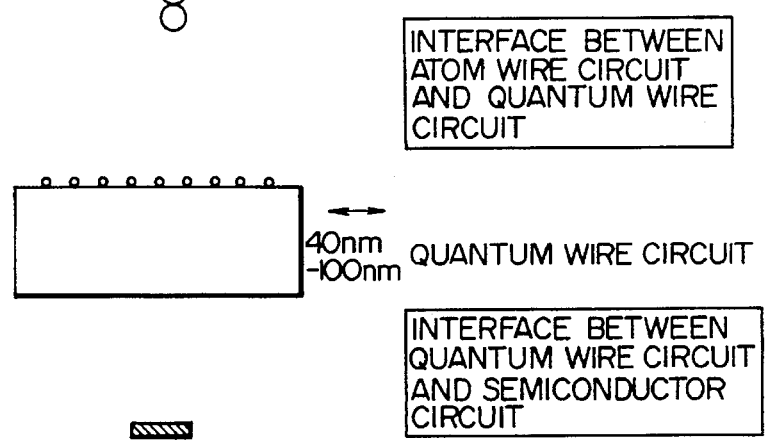
Figure 26C:
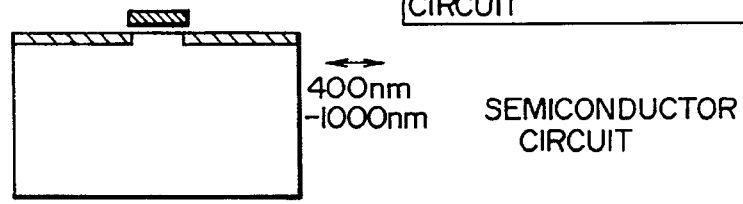
Figure 26D:
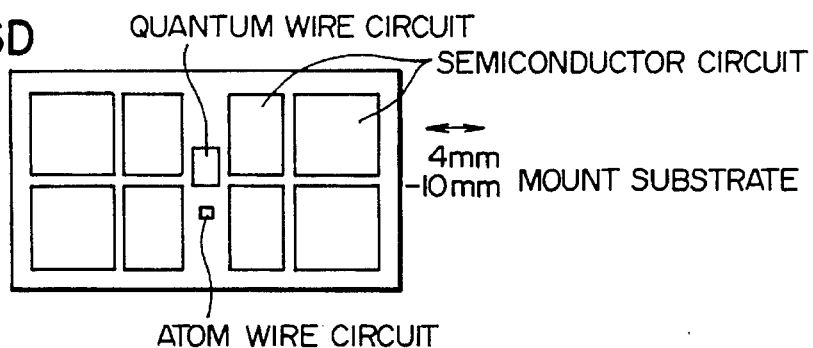
Figure 26E:
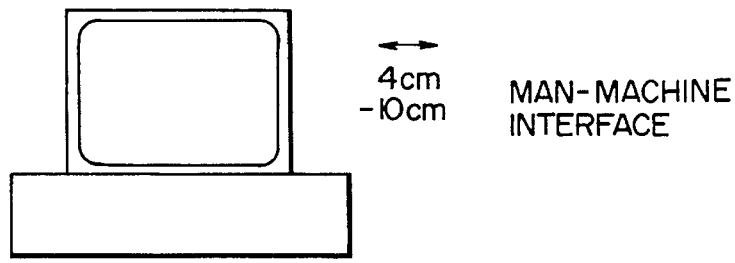

FIG. 25 shows an example of a memory circuit using atomic switches, constituted by a power supply line 311, a reset line 312, a data line 313, a complementary data line 314, a write line 320, and a read line 309. The data write operation of this memory cell is executed by the following processes. When a memory cell is selected by the write line 320, switching atoms 316 enter an on-state so that the switching atoms 315 turn on one of output lines 318 and 319 and turn off the other in accordance with the data inputted to the data lines 313 and 314. When a reset pulse is applied to the reset line, the write operation is inhibited. In reading data under the write inhibited state, the read line 309 is selected to move switching atoms 317 and make the output lines conductive so that a "High" signal is outputted from one of the output lines 318 and 319 and a "Low" signal from the other, depending upon the positions of the switching atoms 315. This memory cell is always supplied with current or pulse signal from the power supply line 311. It is therefore always possible to read data upon selection of the read line 309. Therefore, the memory cell shown in FIG. 24 can be called a dynamic type, whereas the memory cell of this embodiment can be called a static type.

Next, a method of forming an atom wire circuit will be described.

FIGS. 26A to 26E show an atom wire device, a quantum wire device, a semiconductor device, a mount substrate, and a man-machine interface, respectively, while comparing the sizes of the atom wire device, quantum wire device, and semiconductor device. The sizes of the atom wire device (atomic switch), quantum wire device, and semiconductor device are different by about one digit between each device. The sizes of the semiconductor device and mount substrate are different by about four digits. The sizes of the mount substrate and man-machine interface are different by about one digit. The sizes of the atom wire device and man-machine interface are different by seven digits in total. An atom wire device can provide a high integration density two digits higher in length and four digits higher in area than those of current semiconductor devices.

In order to pick up a signal from an atom wire device, the signal is required to be transformed by providing an interface between the atom wire device and quantum wire device and an interface between the quantum wire device and semiconductor device. The former interface may be a device operable upon electrons whose number is in the order required for the operation of an atomic switch, for example, a mono-electron transistor (K. Likharev, IBM J. Res. Develop., 32(1), 144 (1988)). The latter interface may be an extremely high speed semiconductor device such as HEMT having an operation speed compatible with that of a quantum wire circuit.

As shown in FIG. 27, an integrated circuit of atom wire circuits includes an arithmetic/logic circuit, memory, peripheral logical circuits, and the like. It is possible for one chip to provide all functions of an information processor. This atom wire integrated circuit is connected via the quantum wire circuit shown in FIG. 26B to the semiconductor circuit which is used as input/output processors for the man-machine interface.

Figure 28A:
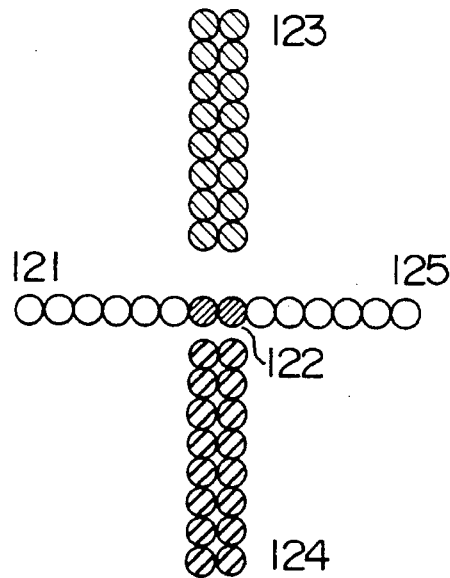
FIGS. 28A and 28B show other examples of the structure of an atomic switch.
Figure 28B:
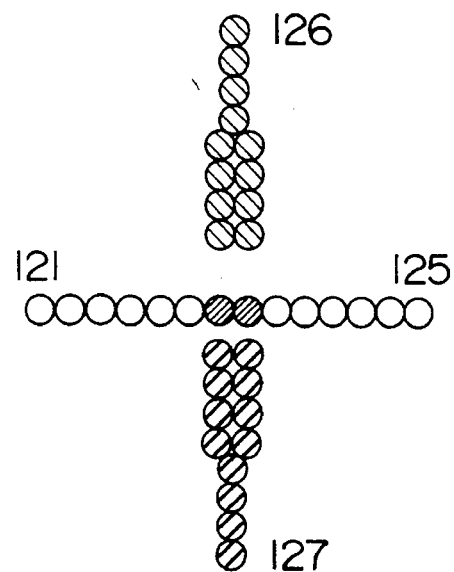

Another structure of an atomic switch will be described. FIGS. 28A shows switching gates 123 and 124, and 126 and 127 formed by an atom wire having a plurality of atom trains, the switching gates 123 and 124 switching a plurality of switching atoms 122. The switching gates may have a plurality of switching atom trains at the midway thereof, as shown in FIG. 28B. In FIGS. 28A and 28B, an atom wire having two atom trains is shown. Needless to say, an atom wire may have three or more atom trains, or may be in a ring shape or three-dimensional shape.

Figure 29:
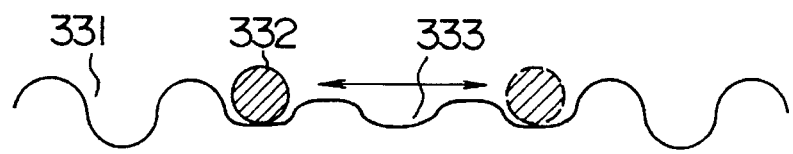
FIG. 29 is a diagram illustrating the principle of the position control of a switching atom by using solid material surface potentials.

FIG. 29 discloses the structure of a switching atom. A switching atom 332 is positioned at an area 333 having a low substrate potential distribution, and a bias applied to the switching gate is controlled so that the switching atom 332 moves only within an area surrounded by an area 331 having a high substrate potential distribution. Therefore, even if a plurality of switching atoms are moved at the same time, they are held within an area necessary for the switching operation and no erroneous operation will occur. As an example of manufacturing a substrate having both the low potential distribution area 333 and high potential distribution area 331, it is conceivable to use a method of forming a molybdenum disulfide layer on graphite.

Next, a voltage regulator will be disclosed.

Figure 30:
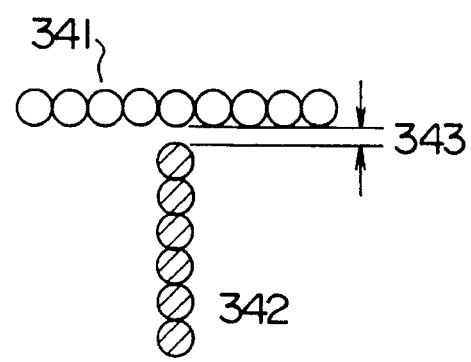
FIG. 30 is a diagram illustrating the operation principle of a voltage regulator.

FIG. 30 shows an atom wire 341 and another atom wire 342 facing the atom wire 341 spaced by a distance 343. The quantity of current flowing from the atom wire 341 to the atom wire 342 is determined by a voltage which is dependent on the distance 343. Therefore, a maximum voltage to be applied to the atom wire 342 can be regulated. For example, the maximum voltage 10 mV was obtained for the distance 343 of 0.1 nm, and 50 mV for the distance of 0.3 nm. If the atom wire 342 is grounded, this device can function as a voltage regulator for the atom wire 341.

A logical circuit formed by a combination of atom wire FETs of the present invention may be mounted within a vacuum package to maintain the conditions at the manufacturing processes and provide its specific functions, or may be completely sealed by a proper sealing material such as those used by current ICs. To connect an atom wire on a substrate to a pad for connection to an external pin, an atom wire may be extended from a pad formed by the same type of atoms of the atom wire on the substrate.

Next, a method of forming an atom wire will be described which is the basis for forming an atomic switching device and logical circuit. More specifically, there will be described one approach to defining the surface structure by aligning a number of basic atoms in a short time by an STM method of attaching and removing atomic level material.

In this embodiment, an X-ray standing wave is applied to a substrate surface to locally dispose atoms at nodes of the standing wave. The substrate surface may be any surface if it is smooth from the atomic level viewpoint and capable of depositing atoms or molecules at a predetermined temperature. For example, the (111) plane of silicon crystal may be used.

A monochromatic X-ray is used generally. However, a proper compound X-ray may be used depending upon an object surface structure patter.

In forming a pattern by removing atoms or molecules, there is used the phenomenon that coupling of atoms or molecules on a substrate surface is released by applying an X-ray to the surface.

Means for changing the temperature of a substrate surface may be a heater or cooling agent to be determined from a combination of the substrate surface and atoms attached to the surface.

More specific examples will be described with reference to the drawings.

Figure 13:
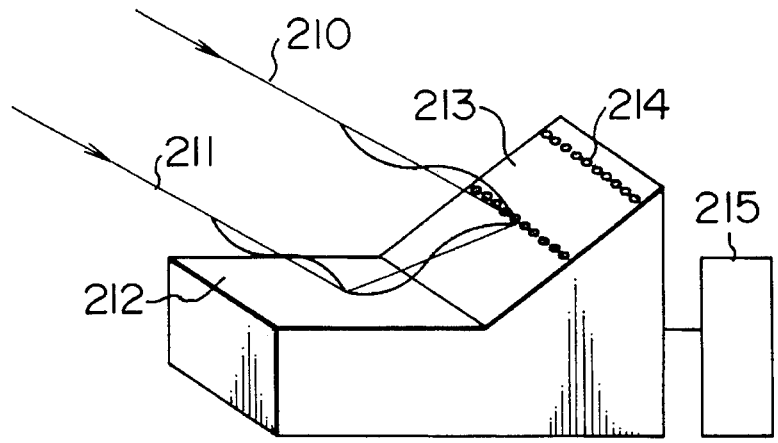
FIG. 13 illustrates the principle of a method of defining a surface structure according to the present invention.

FIG. 13 shows an example using highly coherent X-rays radiated from one radiation source. Highly coherent X-rays are impinged upon a substrate surface 213 via two paths. One X-ray A 210 directly reaches the substrate surface 213, and the other X-ray B 211 reaches the substrate surface 213 after it was once reflected by a reflection plane 212. The X-rays A 210 and B 211 are mixed so that a standing wave is generated which is in parallel with the reflection plane 212 and has a period corresponding to the angle between the reflection plane 212 and the X-ray B211.

Molecules are easily collected at areas of nodes of the standing wave because the electric field does not change at these areas. Therefore, attached atoms 214 can be patterned in a desired shape, by setting the substrate surface 213 to such areas while setting a proper angle relative to the reflection plane 212. The electric field at antinodes of the standing wave changes greatly and nearby atoms or molecules become unstable. Therefore, they can be removed easily, upon application of stimulus of heat or light.

In the embodiment shown in FIG. 13, the X-rays A 210 and B 211 radiated from a single radiation source are incident from the left side to the substrate surface 213 and reflection plane 212. Although the description has been made as if two separate X-rays A 210 and B 211 are used, one X-ray having a certain area is radiated in actual. The X-ray B 211 is reflected by the reflection plane 212 and reaches the substrate surface 213. The angle between the X-ray B 211 and the reflection plane 212 was set to 0.54 degree.

As an X-ray source, a monochromatic X-ray at 13.4 keV was picked up from synchrotron radiation rays by using a monochromator having an Si (111) plane. Any other monochromatic X-rays may be used, or a compound X-ray suitable for an object pattern may also be used. The substrate surface 213 was inclined by 10 degrees relative to the reflection plane 212 by working an Si substrate. After polishing the substrate surface 213 and reflection plane 212, the substrate was dipped within super pure water at 100° C. for 5 minutes to perform surface treatment. These processes were performed within a vacuum vessel. The requirement of vacuum depends on the state of a substrate surface and the type of atoms or molecules.

Gold was vapor deposited on the substrate surface 213 while applying a standing wave, in one hour in the order of a 0.01 atom layer (mono-layer). The temperature of the substrate surface 213 was maintained 200° C. by using a temperature controller 215. After lowering the temperature of the substrate surface 213 to the room temperature, the substrate surface was observed through an STM. It was confirmed that gold atom wires (each being a train of atoms at an interval of 0.3 nm) were formed in parallel at an interval of about 30 nm.

In another example like shown in FIG. 13, $MoS_2$ was used as the reflection plane 212 and substrate surface 213, and the (111) plane of the substrate surface was used. In this example, the reflection plane 212 and substrate surface 213 incline each other by 10 degrees. After starting the radiation of X-rays A 210 and B 211, the substrate was heated to 500° C. and maintained at this temperature for three hours. After lowering the temperature of the substrate surface 213 to the room temperature, the substrate surface was observed through an STM. It was confirmed that grooves were formed in parallel at an interval of about 30 nm, each groove having a width of about three atoms.

Figure 14:
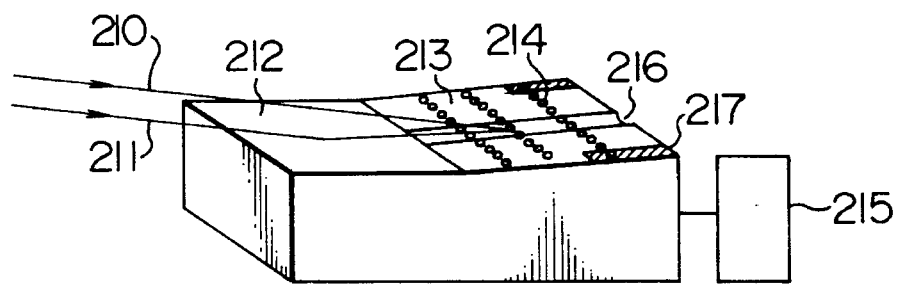
FIG. 14 shows an example of atom wires bridging over a groove.

FIG. 14 shows another example wherein an atom wire is bridged over a groove.

X-rays A 210 and B 211 are incident from the left side to the substrate surface 213 and reflection plane 212. The X-ray B 211 is reflected by the reflection plane 212 and reaches the substrate surface 213. The angle between the X-ray B 211 and the reflection plane 212 was set to 0.54 degree.

As an X-ray source, a monochromatic X-ray at 13.4 keV was picked up from synchrotron radiation rays by using a monochromator having an Si (111) plane. Any other monochromatic X-rays may be used, or a compound X-ray suitable for an object pattern may also be used.

The substrate surface 213 was inclined by 10 degrees relative to the reflection plane 212 by working an Si substrate. After polishing the substrate surface 213 and reflection plane 212, the substrate was dipped within super pure hot water for 5 minutes to perform surface treatment.

A groove was formed by STM on the substrate surface 213, the depth and width of the groove being about 5 atoms. Electrodes were formed on opposite sides of the groove. Also in this example, these processes were performed within a vacuum vessel. The requirement of vacuum depends on the state of a substrate surface and the type of atoms or molecules.

Gold was vapor deposited on the substrate surface 213 while applying a standing wave, in one hour in the order of a 0.01 mono-layer. The temperature of the substrate surface 213 was maintained 200° C. by using a temperature controller 215.

After lowering the temperature of the substrate surface 213 to the room temperature, the substrate surface was observed through an STM. It was confirmed that atom wires were formed in parallel at an interval of about 30 nm, and that each atom wire was bridged over the groove. A current of 1 nA flew through the atom wire between the electrodes 217 at a voltage 0.1 V. This is a significant difference from a current of 0.1 nA without bridging.

Figure 15:
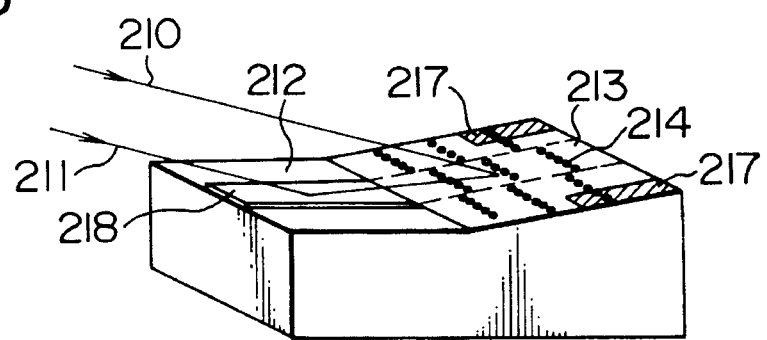
FIG. 15 shows an example of controlling the positions of attached atoms by using a phase converter film.

FIG. 15 shows another example wherein a phase converter film 218 is formed on the reflection surface 212 so that the position of atoms 214 attached on the substrate surface 213 can be controlled by changing the phase of an X-ray B 211.

X-rays A 210 and B 211 are incident from the left side to the substrate surface 213 and reflection plane 212. The X-ray B 211 is reflected by the reflection plane 212 and reaches the substrate surface 213. The angle between the X-ray B 211 and the reflection plane 212 was set to 0.54 degree.

As an X-ray source, a monochromatic X-ray at 13.4 keV was picked up from synchrotron radiation rays by using a monochromator having an Si (111) plane. Any other monochromatic X-rays may be used, or a compound X-ray suitable for an object pattern may also be used.

The substrate surface 213 was inclined by 10 degrees relative to the reflection plane 212 by working an Si substrate. The phase converter film 218 was formed on the substrate surface 213 by laminating a 60 mono-layer of lead stearate $PbSt_2$ by means of an LB method.

Gold was vapor deposited on the substrate surface 213 while applying a standing wave, in one hour in the order of a 0.01 mono-layer. The temperature of the substrate surface 213 was maintained 200° C. by using a temperature controller 215.

After raising the temperature of the substrate surface 213 to 400° C., a current of 1 nA flew between electrodes 217 at a voltage of 0.15 V. Under this condition, the angle between the X-ray B 211 and reflection surface 212 was set to 0.55 degree. It was observed that the current flew scarcely. After the angle between the X-ray B 211 and reflection surface 212 was set again to 0.54 degree, a current of 1 nA flew between the electrodes at 0.15 V.

After the angle between the X-ray B 211 and reflection surface 212 was set to 0.55 degree again, the temperature of the substrate surface 213 was lowered to the room temperature. It was confirmed through an STM observation that the central area of each atom wire disposed in parallel at an interval of about 30 nm moved by several atoms. In this example, the angle between the X-ray B 211 and reflection surface 212 is changed to move the position of an atom wire. The position of an atom wire may be moved by changing the energy (wavelength) of the X-rays A 210 and B 211.

Figure 16:
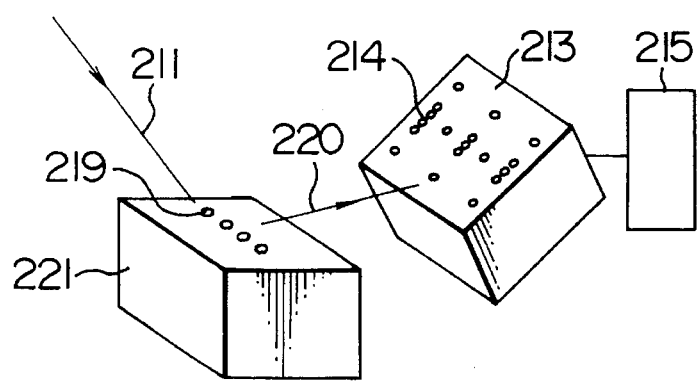
FIG. 16 shows an example of configuring a surface structure by using X-ray diffraction.

FIG. 16 shows another example. In this example, An X-ray B 211 is incident from the left side to a diffraction substrate 221, and is diffracted by three Au diffraction atoms 219 formed at an equal pitch by an STM method to reach the substrate surface 213 as X-rays 220. The diffraction atoms 219 have a different scattering power of X-ray from that of the diffraction substrate. The number and positions of diffraction atoms can be determined through calculation or a hologram method, basing upon an object pattern.

As an X-ray source, a monochromatic X-ray at 13.4 keV was picked up from synchrotron radiation rays by using a monochromator having an Si (111) plane. Any other monochromatic X-rays may be used, or a compound X-ray suitable for an object pattern may also be used.

Gold was vapor deposited on the substrate surface 213 in three hours in the order of a 0.1 mono-layer. The temperature of the substrate surface 213 was maintained 200° C. by using a temperature controller 215. After lowering the temperature of the substrate surface 213 to the room temperature, the substrate surface 213 was observed by an STM. It was confirmed that a pattern of attached atoms 214 shown in FIG. 16 was obtained.

Figure 17:
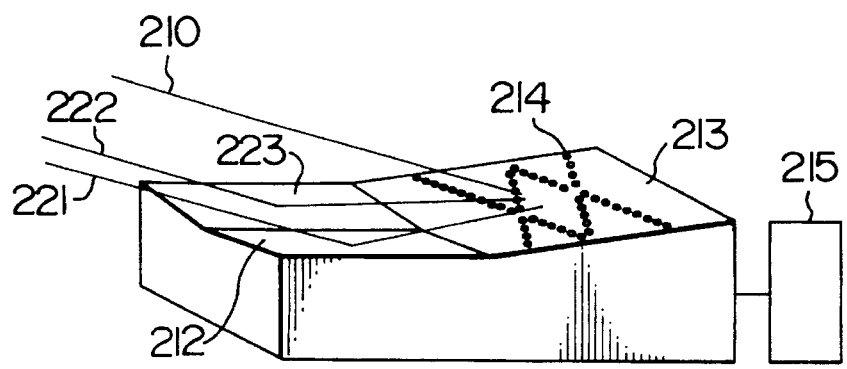
FIG. 17 shows an example of configuring a surface structure by using a plurality of reflection planes.

FIG. 17 shows another example wherein a plurality of reflection surfaces (in this example, reflection surfaces 212 and 213) are provided to obtain a lattice type atom pattern. X-rays A 210, B 211, and C 222 are incident from the left side to the substrate surface 213, reflection plane 212, and reflection plane 223, respectively. The X-ray B 211 is reflected by the reflection plane 212 to reach the substrate surface 213, and the X-ray C 222 is reflected by the reflection plane 223 to reach the substrate surface 213. The angle between the X-ray B 211 and the reflection plane 212 was set to 0.54 degree, and the angle between the X-ray C 222 and the reflection plane 223 was set to 0.50 degree.

As an X-ray source, a monochromatic X-ray at 13.4 keV was picked up from synchrotron radiation rays by using a monochromator having an Si (111) plane. Any other monochromatic X-rays may be used, or a compound X-ray suitable for an object pattern may also be used.

The substrate surface 213 was inclined by 10 degrees relative to the reflection plane 212 and by 7 degrees relative to the reflection plane 223, and the reflection plates 212 and 223 were inclined each other by 5 degrees, by working an Si substrate. The number of reflection planes, the angle between the reflection plane and substrate surface, and the angle between reflection planes, are determined in accordance with an object pattern.

Gold was vapor deposited on the substrate surface 213 while applying a standing wave, in one hour in the order of a 0.01 mono-layer. The temperature of the substrate surface 213 was maintained 200° C. by using a temperature controller 215.

After lowering the temperature of the substrate surface 213 to the room temperature, the substrate surface was observed through an STM. It was confirmed that atom wires disposed at an interval of 30 nm and atom wires disposed at an interval of 40 nm were intersected at an angle of about 20 degrees to take a lattice atom pattern.

Figure 18:
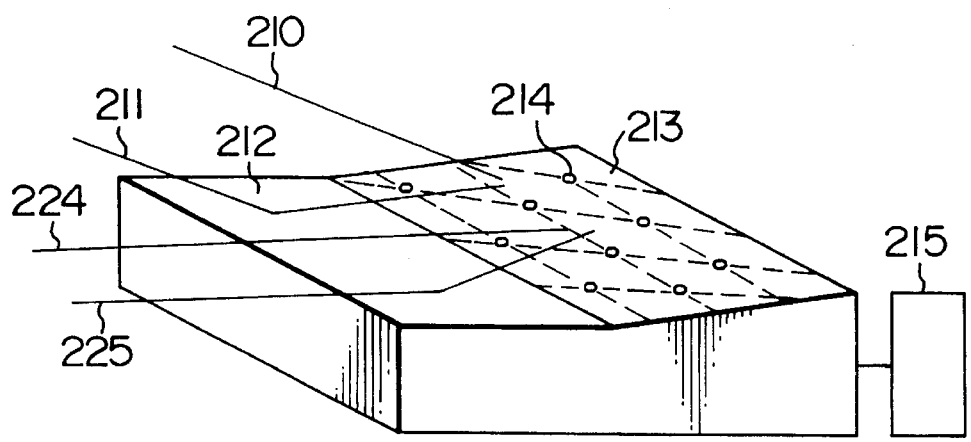
FIG. 18 shows an example of configuring a surface structure by using a plurality of X-ray sources.

FIG. 18 shows another example wherein a surface structure is configured using two or more X-ray sources. X-rays A 210 and B 211 radiated from an X-ray source and X-rays D 224 and E 225 radiated from a different X-ray sources are incident from the left side to the substrate surface 213 and reflection plane 212. The angle between the X-ray B 211 and the reflection plane 212 was set to 0.54 degree, the angle between the X-ray E 225 and the reflection plane 212 was set to 0.54 degree, and the angle between the X-ray B 211 and the X-ray E 225 was set to 60 degrees.

As the X-ray sources, monochromatic X-rays at 13.4 keV were picked up from synchrotron radiation rays by using monochromators having an Si (111) plane. Any other monochromatic X-rays may be used, or a compound X-ray suitable for an object pattern may also be used.

The substrate surface 213 was inclined by 10 degrees relative to the reflection plane 212 by working an Si substrate. Gold was vapor deposited on the substrate surface 213 while applying a standing wave, in one hour in the order of a 0.01 mono-layer. The temperature of the substrate surface 213 was maintained 200° C. by using a temperature controller 215.

After lowering the temperature of the substrate surface 213 to −100° C., the substrate surface was observed by an STM. It was confirmed that atoms were disposed at an interval of about 30 nm.

As appreciated from the foregoing description, the atomic level surface structure can be formed by the above-described methods, providing basic surfaces upon which an STM is manipulated and providing easy setup of devices and circuits.

What is claimed is:

1. An atomic switch comprising:

an atom wire having a plurality of atoms which are laid on a substrate and arranged so as to provide an interaction between electrons of said atoms and between said atoms and said substrate; and means for changing the conductance of said atom wire by moving a particular atom of said atom wire, wherein the interaction between said substrate and the atoms of said atom wire, other than said particular atom, is larger than the interaction of said particular atom of said atom wire and said substrate.

2. An atomic switch according to claim 1, wherein said atom wire is a first atom wire, and wherein the atomic switch further comprises a second atom wire having a plurality of atoms arranged so as to provide an interaction between electrons of said atoms, said first and second atom wires intersect each other with an interlayer insulating atom being interposed between them at the point of intersection.

3. An atomic switch according to claim 1, wherein said means for changing conductance is arranged to move a plurality of particular atoms of said atom wire.

4. An atomic switch according to claim 1, wherein said substrate is comprised of silicon, said atom wire is comprised of silicon atoms, and said particular atom is a gold atom.

5. An atomic switch according to claim 1, wherein said means for changing the conductance of said atom wire comprises a switching gate comprising another atom wire located to move the particular atom by a field effect.

6. An atomic circuit comprising:

an atom wire having a plurality of atoms which are laid on a substrate and arranged so as to have an interaction between electrons of said atoms and between said atoms and said substrate; and an atomic switch gate for an information Storing function including means for changing the conductance of said atom wire by moving a particular atom of said atom wire from a first position to a second position, wherein the interaction between said substrate and the atoms of said atom wire, other than said particular atom, is larger than the interaction of said particular atom of said atom wire and said substrate.

7. An atomic circuit according to claim 6, wherein a plurality of said atom wires are provided, wherein said atomic circuit further comprises means for setting a distance between two adjacent atom wires, to a distance equal to or longer than a distance providing substantially no interaction between atoms of said two adjacent atom wires.

8. An atomic circuit according to claim 6, wherein a plurality of said atom wires are provided, and wherein said atomic circuit further comprises means for generating a synchronizing reset signal for synchronizing movement of said particular atoms from said second position back to said first position.

9. An atomic circuit according to claim 6, wherein said means for changing the conductance of a corresponding atom wire is arranged to move a plurality of particular atoms in said corresponding atom wire.

10. An atomic circuit according to claim 6, wherein said substrate is comprised of silicon, said atom wire is comprised of silicon atoms, and said particular atom is a gold atom.

11. An atomic circuit comprising:

an atom wire having a plurality of atoms which are laid on a substrate and arranged so as to have an interaction between electrons of said atoms and between said atoms and said substrate; and an atomic switch gate for a logic function including means for changing the conductance of said atom wire by moving a particular atom of said atom wire from a first position to a second position, wherein the interaction between said substrate and the atoms of said atom wire, other than said particular atom, is larger than the interaction of said particular atom of said atom wire and said substrate.

12. An atomic circuit according to claim 11, wherein a plurality of said atom wires are provided, wherein said atomic circuit further comprises means for setting a distance between two adjacent atom wires, to a distance equal to or longer than a distance providing substantially no interaction between atoms of said two adjacent atom wires.

13. An atomic circuit according to claim 11, wherein a plurality of said atom wires are provided, and wherein said atomic circuit further comprises means for generating a synchronizing reset signal for synchronizing movement of said particular atom from said second position back to said first position.

14. An atomic circuit according to claim 11, wherein said means for changing the conductance of a corresponding atom wire is arranged to move a plurality of particular atoms in said corresponding atom wire.

15. An atomic circuit according claim 11, wherein said substrate is comprised of silicon, said atom wire is comprised of silicon atoms, and said particular atom is a gold atom.

16. An atomic switch comprising:
a plurality of independent atom wires each having a plurality of atoms which are laid on a substrate and arranged so as to provide an interaction between electrons of said atoms and between said atoms and said substrate; and
a plurality of independent means for changing the conductance of said atom wires by moving particular atoms of said atom wires, wherein for each of the atom wires the interaction between said substrate and the atoms of said atom wire, other than said particular atom, is larger than the interaction of said particular atom of said atom wire and said substrate;
wherein adjacent atom wires of said plurality of atom wires are spaced apart at least by a distance equal to the distance providing substantially no interaction between atoms constituting said adjacent wires.

17. An atomic switch according to claim 16, wherein each of said plurality of independent atom wires includes a first end and a second end, wherein said plurality of independent means for changing the conductance of said atom wires are located between the first and second ends of the atom wires, wherein the first ends of said plurality of independent atom wires correspond to independent signals, and the second ends of said plurality of independent atom wires are coupled to form a common atom wire.

18. An atomic switch according to claim 17, wherein at least two of said plurality of independent atom wires intersect each other with an interlayer insulating atom being interposed between the intersecting atom wires at the point of intersection.

19. An atomic switch according to claim 16, wherein at least two of said plurality of independent atom wires intersect each other with an interlayer insulating atom being interposed between the intersecting atom wires at the point of intersection.

20. An atomic switch according to claim 16, wherein at least one of said plurality of independent means for changing the conductance of a corresponding atom wire is arranged to move a plurality of particular atoms in said corresponding atom wire.

21. An atomic switch according to claim 16, wherein said substrate is comprised of silicon, said atom wires are comprised of silicon atoms, and said particular atoms are gold atoms.

22. An atomic switch comprising:
a first atom wire having a plurality of atoms which are laid on a substrate and arranged so as to provide an interaction between electrons of said atoms and between said atoms and said substrate;
a second atom wire having a plurality of atoms which are laid on a substrate and arranged so as to provide an interaction between electrons of said atoms and between said atoms and said substrate, electrons of an atom at one end of said second atom wire having an interaction with a particular atom of said first atom wire; and
means for changing the conductance of said second atom wire by moving a particular atom of said second atom wire wherein, for each of the first and second atom wires, the interaction between said substrate and the atoms of said atom wire, other than said particular atom, is larger than the interaction of said particular atom of said atom wire and said substrate.

23. An atomic switch according to claim 22, wherein said means for changing the conductance of said second atom wire is arranged to move a plurality of particular atoms of said second atom wire.

24. An atomic switch according to claim 22, wherein said substrate is comprised of silicon, said first and second atom wires are comprised of silicon atoms, and said particular atom of said second atom wire is comprised of gold.

25. An atom wire field effect switching device comprising:
a first atom wire having a plurality of atoms which are laid on a substrate and arranged in a shape selected from the group consisting of a line, a plurality of lines, a ring line, and a curved line; and
a switching gate comprising a second atom wire which is laid on a substrate and for controlling the electron state of said first atom wire by a field effect.

26. An atom wire field effect switching device according to claim 25, wherein the distance between said first atom wire and said switching gate is set to 1.1 to 4.8 times the distance between atoms.

27. An atom wire field effect switching device according to claim 25, wherein said plurality of atoms comprising said first atom wire provide substantially a metallic conduction characteristic when arranged in an atom wire configuration.

28. An atomic switch comprising:
an atom wire having a plurality of atoms which are laid on a substrate and arranged so as to provide an interaction between electrons of said atoms and between said atoms and said substrate;
means for changing the conductance of said atom wire by moving a particular atom of said atom wire from a first position to a second position wherein the interaction between said substrate and the atoms of said atom wire, other than said particular atom, is larger than the interaction of said particular atom of said atom wire and said substrate; and
reset means for resetting said particular atom back to said first position.

29. An atomic switch according to claim 28, wherein said means for changing conductance is arranged to move a plurality of particular atoms of said atom wire.

30. An atomic switch according to claim 28, wherein said substrate is comprised of silicon, said atom wire is comprised of silicon atoms, and said particular atom is a gold atom.

31. An atomic switch comprising:

a plurality of independent atom wires each having a plurality of atoms which are laid on a substrate and arranged so as to provide an interaction between electrons of said atoms and between said atoms and said substrate;

a plurality of independent means for changing the conductance of said atom wires by moving particular atoms of said atom wires from first positions to second positions wherein, in each of said atom wires, the interaction between said substrate and the atoms of said atom wire, other than said particular atom, is larger than the interaction of said particular atom of said atom wire and said substrate; and a plurality of reset means for synchronizing movement of said particular atoms from said second positions back to said first positions.

32. An atomic switch according to claim 31, wherein each of said plurality of independent atom wires includes a first end and a second end, wherein said plurality of independent means for changing the conductance of said atom wires are located between the first and second ends of the atom wires, wherein the first ends of said plurality of independent atom wires correspond to independent signals, and the second ends of said plurality of independent atom wires are coupled to form a common atom wire.

33. An atomic switch according to claim 32, wherein at least two of said plurality of independent atom wires intersect each other with an interlayer insulating atom being interposed between the intersecting atom wires at the point of intersection.

34. An atomic switch according to claim 31, wherein at least two of said plurality of independent atom wires intersect each other with an interlayer insulating atom being interposed between the intersecting atom wires at the point of intersection.

35. An atomic switch according to claim 31, wherein at least one of said plurality of independent means for changing the conductance of a corresponding atom wire is arranged to move a plurality of particular atoms in said corresponding atom wire.

36. An atomic switch according to claim 31, wherein said substrate is comprised of silicon, said atom wires are comprised of silicon atoms, and said particular atoms are gold atoms.

* * * * *